United States Patent [19]
Dreifus

[11] Patent Number: 5,391,895
[45] Date of Patent: Feb. 21, 1995

[54] DOUBLE DIAMOND MESA VERTICAL FIELD EFFECT TRANSISTOR

[75] Inventor: David L. Dreifus, Cary, N.C.

[73] Assignee: Kobe Steel USA, Inc., Research Triangle Park, N.C.

[21] Appl. No.: 948,505

[22] Filed: Sep. 21, 1992

[51] Int. Cl.[6] .................... H01L 49/00; H01L 29/80; H01L 29/06
[52] U.S. Cl. ........................................ 257/77; 257/76; 257/78; 257/256; 257/263; 257/266; 257/287; 257/623
[58] Field of Search ..................... 257/76, 77, 78, 256, 257/263, 266, 287, 623

[56] References Cited

U.S. PATENT DOCUMENTS

| | | |
|---|---|---|
| 3,603,848 | 9/1971 | Sato . |
| 3,993,515 | 11/1976 | Reichert .................................. 156/3 |
| 4,620,207 | 10/1986 | Calviello ............................. 257/263 |
| 4,643,161 | 2/1987 | Kim . |
| 4,791,462 | 12/1988 | Blanchard et al. .................. 257/266 |
| 4,903,089 | 2/1990 | Hollis et al. . |
| 4,916,499 | 4/1990 | Kawai ................................ 257/192 |
| 4,929,489 | 5/1990 | Dreschhoff et al. . |
| 5,034,784 | 7/1991 | Yamazaki .............................. 257/77 |

FOREIGN PATENT DOCUMENTS 2144367 6/1987 Japan .

OTHER PUBLICATIONS

*ECR Plasma Etching of Natural Type IIa and Synthetic Diamonds,* C. Beetz et al., New Diamond Science and Technology, 1991 MRS Int. Conf. Proc., Proc. of the Sec. Int'l. Symposium on Diamond Materials, pp. 608–614.

*Microfabrication of Diamond Films: Selective Deposition and Etching* K. Kobashi et al., Proceedings of the Second International Conference, New Diamond Science and Technology, 1990.

*Excimer-Laser Etching of Diamond and Hard Carbon Films by Direct Writing and Optical Projection"),* M. Rothschild et al., J. Vac. Sci. Technol. B., vol. 4, No. 1, Jan./Feb. 1986, pp. 310–314.

*Construction and Characterization of a Diamond Thin Film Anemometer,* D. A. Jaworske et al., Proceedings of the Second International Symposium on Diamond Materials, vol. 91-8, The Electrochemical Soc., Inc., pp. 608–614.

*A Thermally Activated Solid State Reaction Process for Fabricating Ohmic Contacts to Semiconducting Diamond,* K. L. Moazed et al., J. Appl. Phys. 68(5), 1990, pp. 2246–2254.

(List continued on next page.)

*Primary Examiner*—Sara W. Crane
*Assistant Examiner*—Valencia M. Wallace
*Attorney, Agent, or Firm*—Bell, Seltzer, Park & Gibson

[57] ABSTRACT

A double diamond mesa vertical field effect transistor includes a diamond layer, a first diamond mesa on a diamond layer, and a second diamond mesa on the first diamond mesa, opposite the diamond layer. A source contact is formed on the second diamond mesa, opposite the first diamond mesa, and a gate is formed on the first diamond mesa opposite the diamond layer. The drain contact may be formed on the diamond layer adjacent the first diamond mesa, or the diamond layer itself may be formed on a nondiamond substrate and a drain contact may be provided on the nondiamond substrate. An integrated array of field effect transistors may be formed, including a plurality of second mesas on the first mesa, with a plurality of gates formed on the first mesa between the second mesas and a source formed on each second mesa, opposite the first mesa. The second mesas may also extend over the multiple gate contacts on the first mesa to form a common source region with a common source contact. The double mesa vertical field transistors may be formed by selective deposition of the first and second mesas on a diamond layer or by etching the first and second mesas in the diamond layer. Selectively epitaxial lateral overgrowth of the second diamond mesas on the first diamond mesa may be used to form a common source contact over multiple gates.

78 Claims, 12 Drawing Sheets

OTHER PUBLICATIONS

*Summary Abstract: Device Applications of Diamonds*, M. W. Geis et al., J. Vac. Sci. Technol. A6(3), May/Jun. 1988, pp. 1953–1954.

*Diamond Transistor Performance and Fabrication*, M. W. Geis, Proceedings of the IEEE, vol. 79, No. 5, May 1991, pp. 669–676.

*Diamond MESFET Using Ultrashallow RTP Boron Doping*, W. Tsai et al., IEEE Electron Device Letters, vol. 12, No. 4, Apr. 1991, pp. 157–159.

*Polycrystalline Diamond Field-Effect Transistors*, A. J. Tessmer et al., Diamond and Related Materials 1, 1992, Elseviers Science Publishers, pp. 89–92.

*IGFET Fabrication on Homoepitaxial Diamond Using In Situ Boron and Lithium Doping*, G. G. Fountain et al., pp. 1–8.

*Fabrication of an Insulated Gate Diamond FET for High Temperature Applications*, C. A. Hewett et al., pp. 168–173.

*High-Temperature Thin-Film Diamond Field-Effect Transistor Fabricated Using a Selective Growth Method*, G. S. Gildenblat et al., IEEE Electron Device Letters, vol. 12, No. 2, Feb. 1992, pp. 37–39.

*A High Voltage-Gain GaAs Vertical Field-Effect Transistor with an InGaAs/Planar-Doped Barrier Launcher*, Y. H. Won et al., IEEE Electron Device Letters vol. 11, No. 9, Sep. 1990, pp. 376–378.

*A Vertical Integration of GaAs/GaAlAs LED and Vertical FET with Embedded Schottky Electrodes*, C. Hong et al., Japanese Journal of Applied Physics, vol. 29, No. 12, Dec. 1990, pp. L2427–L2429.

*Determination of Electron Energy Distribution in a GaAs Vertical Field-Effect Transistor with Hot-Electron Injection*, K. Yamasaki et al., Appl. Phys. Lett. 54(3), Jan. 1989, pp. 274–276.

*Vertical Integration of GaAs/AlGaAs Laser Diode and Vertical JFET*, H. Yoo et al., Japanese Journal of Applied Physics, vol. 27, No. 3, Mar. 1988, pp. L431–L433.

*A Numerical Analysis of a Short Verical $n^+$–$n$–$n^+$ GaAs MESFET*, C. Lyden et al. IEEE Electron Device Letters, vol. EDL-5, No. 2, Feb. 1984, pp. 43–44.

*Vertical Field-Effect Transistors in III–V Semiconductors*, Z. Rav-Noy et al., Appl. Phys. Lett. 45(3) Aug. 1984, pp. 258–260.

*Vertical FET's in GaAs*, Z. Rav-Noy et al., IEEE Electron Device Letters, vol. EDL-5, No. 7, Jul. 1984, pp. 228–230.

*Semiconductors for High-Voltage, Vertical Channel Field Effect Transistors*, B. J. Baliga, J. Appl. Phys. 53(3), Mar. 1982, pp. 1759–1764.

*Ion-Implanted FET for Power Applications*, D. P. Lecrosnier et al., Transactions on Electron Devices, vol. ED-21, No. 1, Jan. 1974, pp. 113–118.

*Complementary Vertical Bipolar Transistor Process Using High-Energy Ion Implantation*, F. W. Ragay et al., Electronic Letters, vol. 27, No. 23, Nov. 1991, pp. 2141–2143.

*A High-Power High-Gain VD-MOSFET Operating at 900 $MH_z$*, O. Ishikawa et al., IEEE Transactions on Electron Devices, vol. ED-34, No. 5, May 1987, pp. 1157–1162.

*Vertical-Type Amorphous-Silicon Field-Effect Transistors with Small Parasitic Elements*, Y. Uchida et al., Japanese Journal of Applied Physics, vol. 25, No. 7, Sep. 1986, pp. L798–L800.

*Proposed Vertical-Type Amorphous-Silicon Field-Effect Transistors*, Y. Uchida et al., IEEE Electron Device Letters, vol. EDL-5, No. 4, Apr. 1984, pp. 105–107.

*A Vertical FET with Self-Aligned Ion-Implanted Source and Gate Regions*, O. Ozawa et al., IEEE Transactions on Electron Devices, vol. ED-25, No. 1, Jan. 1978, pp. 56–57.

*Pattern Transfer Onto Carbon Films on Silicon Using Radio Frequency Oxygen Plasma Etching*, K. K. Chan et al., J. Vac. Sci. Technol. A10(1), Jan./Feb. 1992, pp. 225–228.

*Characterization of Boron-Doped Diamond Epitaxial Films and Applications for High-Voltage Schottky Diodes and MESFET's*, H. Shiomi et al, New Diamond Science and Technology, MRS Int. Conf. Proc. 1991, pp. 975–980.

DOUBLE DIAMOND MESA VERTICAL FIELD EFFECT TRANSISTOR

FIELD OF THE INVENTION

This invention relates to field effect transistors, and more particularly to vertical field effect transistors.

BACKGROUND OF THE INVENTION

There are two general schemes for integrating a Field Effect Transistor (FET) into a semiconductor substrate: horizonal and vertical integration. In horizontal integration, carrier flow in the field effect transistor, from source to drain, occurs in the direction parallel to the plane of the substrate, i.e. parallel to the top and bottom faces of the substrate. In contrast, in a vertical FET, current flow from the source to the drain occurs transverse to the plane of the substrate, i.e. transverse to the top and bottom faces of the substrate.

Horizontal FETs are widely used because of the relative ease of isolation among devices, and because of the ease of application to large scale integration. Large scale integration is more easily implemented with horizontal FETs because the drain, source and gate contacts are all located on one face of the substrate. Vertical FETs, on the other hand, generally have a superior power-delay product and a higher power handling capacity compared with their horizontal counterparts. Moreover, for high power devices, the provision of a source contact on one substrate face and a drain contact on the opposite substrate face maximizes power handling ability.

In view of these advantages, much development effort has been focused on vertical field effect transistors in silicon and gallium arsenide. Silicon based vertical field effect transistors are described in publications entitled *A Vertical FET With Self-Aligned Ion-Implanted Source and Gate Regions* by Ozawa et al., IEEE Transactions on Electron Devices, Vol. ED-25, No. 1, January 1978, pp. 56–57; *Proposed Vertical-Type Amorphous-Silicon Field-Effect Transistors* by Uchida, IEEE Electron Device Letters, Vol. EDL-5, No. 4, April 1984, pp. 105–107; *Vertical-Type Amorphous-Silicon Field-Effect Transistors with Small Parasitic Elements* by Uchida et al., Japanese Journal of Applied Physics, Vol. 25, No. 9, September 1986, pp. L798–L800; *A High-Power High-Gain VD-MOSFET Operating at 900 MHz* by Ishikawa et al., IEEE Transaction on Electron Devices, Vol. ED-34, No. 5, May 1987, pp. 1157–1162; and *Complementary Vertical Bipolar Transistor Process Using High-Energy Ion Implantation* by Ragay et al., Electronics Letters, Vol. 27, No. 23, November 1991, pp. 2141–2143.

Gallium arsenide based vertical field effect transistors are described in U.S. Pat. No. 4,903,089 to Hollis et al. entitled *Vertical Transistor Device Fabricated With Semiconductor Regrowth,* and in publications entitled *Ion-Implanted FET for Power Applications* by Lecrosnier et al., Transactions on Electron Devices, Vol. ED-21, No. 1, January 1974, pp. 113–118; *Semiconductors for High-Voltage, Vertical Channel Field Effect Transistors* by B. J. Baliga, J. Appl. Phys. 53(3), March 1982, pp. 1759–1764; *Vertical FETs in GaAs* by Rav-Noy et al., IEEE Electron Device Letters, Vol. EDL-5, No. 7, July 1984, pp. 228–230; *Vertical Field-Effect Transistors in III-V Semiconductors* by Rav-Noy et al., Appl. Phys. Let. 45(3), August 1984, pp. 258–260; *A Numerical Analysis of a Short Vertical $n^+$-$n^-$-$n^+$ GaAs MESFET* by Lyden et al., IEEE Electron Device Letters, Vol. EDL-5, No. 2, February 1984, pp. 43–44; *Vertical Integration of GaAs/AlGaAs Laser Diode and Vertical JFET* by Yoo et al., Japanese Journal of Applied Physics, Vol. 27, No. 3, March 1988, pp. L431–L433; *Determination of Electron Energy Distribution in a GaAs Vertical Field-Effect Transistor With Hot-Electron Injection* by Yamasaki et al., Appl. Phys. Lett. 54(3), January 1989, pp. 274–276; *A Vertical Integration of GaAs/GaAlAs LED and Vertical FET With Embedded Schottky Electrodes* by Hong et al., Japanese Journal of Applied Physics, Vol. 29, No. 12, December 1990, pp. L2427–L2429; and *A High Voltage-Gain GaAs Vertical Field-Effect Transistor With an InGaAs/GaAs Planar-Doped Barrier Launcher* by Won et al, IEEE Electron Device Letters, Vol. 11, No. 9, September 1990, pp. 376–378.

Diamond is a preferred material for semiconductor devices because it has semiconductor properties that are better than silicon, germanium or gallium arsenide. Diamond provides a higher energy bandgap, a higher breakdown voltage and a higher saturation velocity than these traditional semiconductor materials.

These properties of diamond yield a substantial increase in projected cutoff frequency and maximum operating voltage compared to devices fabricated using silicon, germanium or gallium arsenide. Silicon is typically not used at temperatures higher than about 200° C. and gallium arsenide is not typically used above 300° C. These temperature limitations are caused, in part, because of the relatively small energy band gaps for silicon (1.12 eV at ambient temperature) and gallium arsenide (1.42 eV at ambient temperature). Diamond, in contrast, has a large band gap of 5.47 eV at ambient temperature, and is thermally stable up to about 1400° C.

Diamond has the highest thermal conductivity of any solid at room temperature and exhibits good thermal conductivity over a wide temperature range. The high thermal conductivity of diamond may be advantageously used to remove waste heat from an integrated circuit, particularly as integration densities increase. In addition, diamond has a smaller neutron cross-section which reduces its degradation in radioactive environments, i.e., diamond is a "radiation-hard" material.

Because of the advantages of diamond as a material for semiconductor devices, there is at present an interest in the growth and use of diamond for high temperature and radiation-hardened electronic devices. Since FETs are fundamental building blocks of modern integrated circuits, there is interest in the design and fabrication of diamond FETs.

The design and fabrication of horizontal diamond FETs have been widely reported in the art. See for example, U.S. Pat. No. 3,603,848 entitled *Complementary Field-Effect-Type Semiconductor Device* by Sato et al. and publications entitled *High-Temperature Thin-Film Diamond Field-Effect Transistor Fabricated Using a Selective Growth Method* by Gildenblat et al., IEEE Electron Device Letters, Vol. 12, No. 2, February 1991, pp. 37–39; *Fabrication of an Insulated Gate Diamond FET for High Temperature Applications* by Hewett et al., presented at the International High Temperature Electronics Conference in Albuquerque, N.M., June 1991, pp. 168–173; *IGFET Fabrication of Homoepitaxial Diamond Using in Situ Boron and Lithium Doping* by Fountain et al., presented at the Electrochemical Society meeting held in Washington, D.C. in May, 1991; and

*Diamond MESFET Using Ultrashallow RTP Boron Doping* by Tsai et al., IEEE Electron Device Letters, Vol. 12, No. 4, April 1991, pp. 157–159. See also the publication by A. J. Tessmer, K. Das and D. L. Dreifus entitled *Polycrystalline Diamond Field-Effect Transistors*, Diamond and Related Materials I (1992), pp. 89–92, Elsevier Science Publishers B. V., Amsterdam, Holland.

Development of vertical diamond FETs has not been as widely reported or as successful. A proposed diamond vertical FET structure is described in a publication entitled *Diamond Transistor Performance and Fabrication* by Geis, Proceedings of the IEEE, Vol. 79, No. 5, May 1991, pp. 669–676. Described at FIGS. 2 and 3 is a possible vertical field effect transistor formed on a conducting diamond substrate and having a bottom drain contact thereon, and a homoepitaxial boron doped diamond layer including gate and source regions. The publication notes, at page 670, that "at present, the technical problems in manufacturing a highly conductive diamond substrate have not been solved . . . ". See also an earlier publication by Geis et al. entitled *Device Applications of Diamonds*, Journal of Vacuum Society Technology, Vol. A6, No. 3, May–June 1988, pp. 1953–1954.

In conclusion, although vertical diamond field effect transistors are highly desirable, the art has not heretofore suggested a viable vertical diamond field effect transistor structure, or manufacturing process therefor.

SUMMARY OF THE INVENTION

It is therefore an object of the invention to provide an improved diamond field effect transistor.

It is another object of the invention to provide an improved vertical diamond field effect transistor.

It is yet another object of the invention to provide an improved method of making a vertical diamond field effect transistor.

These and other objects are provided, according to the invention, by a vertical field effect transistor including a diamond layer, a first diamond mesa on the diamond layer and a second diamond mesa on the first diamond mesa, opposite the diamond layer. The diamond layer and second diamond mesa are preferably relatively heavily doped, and the first diamond mesa therebetween is preferably relatively lightly doped. The diamond layer, first diamond mesa and second diamond mesa are preferably of the same conductivity type. A source contact is formed on the second diamond mesa, opposite the first diamond mesa, and a gate is formed on the first diamond mesa opposite the diamond layer. A drain contact may be formed on the diamond layer, adjacent the first diamond mesa, to define a vertical channel for carrier conduction through the first diamond mesa. A vertical field effect transistor particularly suitable for large scale integration is thereby provided, with source, drain and gate contacts all on one side of the device. Alternatively, the diamond layer may itself be formed on a nondiamond substrate, and a drain contact may be provided on the nondiamond substrate, opposite the diamond layer, to provide a vertical field effect transistor with front and back contacts.

An integrated array of field effect transistors may also be formed, according to the present invention. The array includes a plurality of second mesas on the first mesa, with a plurality of gates formed on the first mesa between the second mesas, and a source formed on each second mesa, opposite the first mesa. A drain contact may be provided on the diamond layer or on the back face of a substrate on which the diamond layer is formed, to provide integrated and discrete versions of the device, respectively. Alternatively, a plurality of drain contacts may be provided. Each second mesa is preferably a single grain of diamond to enhance current conduction therethrough by minimizing the number of grain boundaries. The sources and gates may form independent vertical field effect transistors with a common drain or independent drains. Alternatively, the sources and gates may be electrically connected in parallel using respective conductor filled vias which connect the sources to a common source bus and the gates to a common gate bus. A power device, including a plurality of individual devices electrically connected in parallel, is thus formed.

In yet another embodiment, the second mesas may extend over the multiple gate contacts on the first mesa to form a common source region. A common source contact may then be formed on the common source region.

The double mesa vertical field effect transistors of the present invention may be formed by selective deposition of the first and second mesas on a diamond layer. Alternatively, the first and second mesas may be etched in the diamond layer. A common source contact over the multiple gates may be formed by selective epitaxial lateral overgrowth of the second diamond mesas on the first diamond mesa, followed by metallization. A double diamond mesa vertical field effect transistor, suitable for discrete or integrated circuit use, is thereby formed.

DESCRIPTION OF THE PREFERRED EMBODIMENTS

Figure 1:
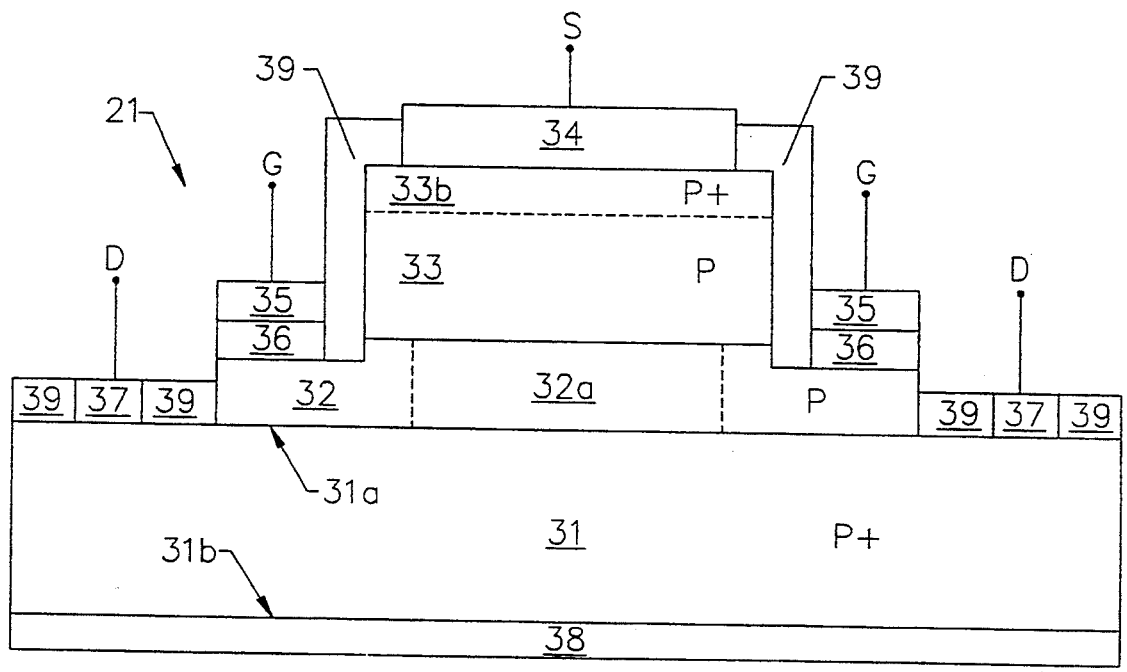
FIG. 1 is a cross-sectional side view of a double diamond mesa vertical field effect transistor according to the present invention.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout.

Referring now to FIG. 1, a first embodiment of a double diamond mesa vertical field effect transistor 21 according to the present invention is illustrated. The transistor 21 includes a heavily doped diamond layer 31 having a first (top) face 31a and a second (bottom) face 31b. The diamond layer is preferably heavily doped of first conductivity type. For example, the diamond layer 31 may be boron doped at a dopant level of $10^{19}$–$10^{20}$ atoms cm$^{-3}$ to provide a p+ layer. Other dopants, such as those from Group IIIb, may be used. Other well known dopants may be used to form an n++ substrate, such as those elements in Group Va. The heavily doped diamond layer 31 is preferably thicker than about 0.5 μm.

Still referring to FIG. 1, a first diamond mesa 32 is formed on the first face 31a of diamond layer 31. The first diamond mesa 32 is preferably lightly doped of the same conductivity type as diamond layer 31. For example, boron doping at about $10^{16}$–$10^{18}$ atoms cm$^{-3}$ may provide p conductivity. The first diamond mesa 32 is preferably between about 1 μm to about 5 μm thick. A second diamond mesa 33 is formed on first diamond mesa 32, opposite diamond layer 31. The second diamond mesa 33 preferably lightly doped and preferably includes heavily doped top portion 33b of the same conductivity type as diamond layer 31. For example, the second mesa 33 may be boron doped at a doping level of $10^{16}$–$10^{18}$ atoms cm$^{-3}$ and portion 33b may be doped at $10^{19}$–$10^{20}$ atoms cm$^{-3}$. The second diamond mesa 33 is preferably between about 0.5 μm to about 2 μm thick.

A source contact 34 is provided on second diamond mesa 33 opposite first diamond mesa 32. The source contact preferably forms an ohmic contact and may comprise a bilayer material including a passivating layer of nonrefractory metal such as gold, on a refractory metal layer such as titanium. Other known source contact configurations can be used.

A gate contact 35 is provided on first diamond mesa 32 opposite diamond layer 31, and adjacent second diamond mesa 33. An optional gate insulating layer 36 may be included between gate contact 35 and first diamond mesa 33. The gate insulating layer 36 is preferably formed of silicon dioxide. Gate insulating layer 31 may be a thick gate insulating layer, such as about 100 Å–1000 Å thick, and preferably about 600 Å thick, or may be a thin gate insulating layer, such as less than about 20 Å thick, to allow tunneling of carriers between the gate electrode 35 and the first diamond mesa A thick gate insulating layer 31 provides operation similar to a junction field effect transistor (JFET), for example a p-n junction field effect transistor or a metal oxide semiconductor field effect transistor (MOSFET). A thin gate insulating layer produces operation similar to a metal insulator semiconductor field effect transistor (MISFET), or alternatively, gate insulating layer 36 may be omitted to provide operations similar to a metal semiconductor field effect transistor (MESFET). See the publication by Shiomi et al. entitled *Characterization of Boron-Doped Diamond Epitaxial Films and Applications for High-Voltage Schottky Diodes and MESFETs*, 1991 MRS Conference Proceedings, pp. 975–980. It will be understood by those having skill in the art that other embodiments of ohmic and rectifying gate contacts may be used. For example, an all diamond rectifying contact comprising a relatively highly doped degenerate layer of diamond on an undoped layer of diamond which is itself formed on a relatively lightly doped layer of diamond may be used, with a metallic ohmic contact formed on the relatively highly doped degenerate layer of diamond. Alternatively, an area of a diamond layer may be transformed into conductive graphite as disclosed in U.S. Pat. No. 4,929,489 to Dreschhoff et al. entitled *Method of Making and Using Selective Conductive Regions in Diamond Layers*.

Still referring to FIG. 1, a drain contact 37 is provided on first face 31a of diamond layer 31, adjacent first diamond mesa 32. Drain contact 37 may be a single metal layer, bilayer or other known configuration. A passivating layer 39, such as a layer of silicon dioxide about 0.5 μm to about 5 μm thick may also be formed on the exposed surface of the device. Passivating layer 39 may be continuous with optional gate insulating layer 36, if present. Source, gate and drain contacts 34, 35 and 36 respectively, may be circular or polygonal in lateral cross section and may preferably be in the form of a ring or bar.

When appropriate voltages are applied between source contact 34 and drain contact 37, a vertical channel 32a is formed in first diamond mesa 32 with carrier movement from source 34 to drain 37 through first diamond mesa 32, transverse to the opposing faces 31a, 31b of diamond layer 31, and the opposing faces of the first and second diamond mesas 32 and 33, respectively. A vertical field effect transistor is thereby formed. It will be understood by those having skill in the art that the source and drain regions can be reversed.

Diamond layer 31, first diamond mesa 32 and second diamond mesa 33 are preferably heteroepitaxial layers; i.e. monocrystalline diamond layers which form a monolithic monocrystalline diamond structure. To facilitate formation of monocrystalline diamond layers, a nondiamond substrate 38 may be provided on second face 31b of diamond layer 31. To facilitate formation of monocrystalline diamond layer 31, nondiamond substrate 38 is preferably crystalline silicon carbide, cubic boron nitride, crystalline copper or crystalline nickel. In order to form a monocrystalline diamond layer, substrate 38 preferably has a relatively close lattice match with the monocrystalline diamond layer 31. By lattice matching, the layers are in atomic registry, namely crystal structures are substantially in alignment with each other. Lattice match relates to the difference between the lattice constant ("$a_0$") of diamond and the nondiamond substrate, and is typically expressed in terms of "lattice mismatch". Preferably, the lattice mismatch is less than about 7%, preferably less than about 4%, and more preferably less than about 2% relative to the lattice constant of diamond. The lattice matching results in a strong atomic bonding and an atomically abrupt interface.

Preferably the nondiamond substrate 38 has minimal stable metal carbides so that carbide formation is avoided at higher temperatures. Nondiamond substrate 38 is preferably selected to have relatively close lattice match with diamond. In particular, the lattice constant of diamond is 3.5668 Å, and the lattice constant of nickel is 3.5238 Å, resulting in a lattice mismatch of about 1.2%. The lattice constant of copper is 3.6153 Å, thereby producing a lattice mismatch with diamond of about 1.4%. When lattice matched conductive metal substrates 38 are used, the substrate inherently includes a drain contact. A separate drain contact on face 31a may not be needed.

Alternatively, one or more of diamond layer 31, first diamond mesa 32 and second diamond mesa 33 may be polycrystalline diamond. In order to form a polycrystalline diamond layer 31, nondiamond substrate 38 is preferably a heavily doped monocrystalline silicon substrate. The vertical field effect transistor so formed possesses a high voltage and current handling capacity and is less susceptible to grain boundary effects in comparison to comparable lateral (horizontal) channel devices due to the geometry of grain boundary incidence. As is well known to those having skill in the art, polycrystalline diamond grains of average grain size approaching 15–20 $\mu$m may be reliably and repeatedly formed on a heavily doped monocrystalline silicon substrate. Larger or smaller average grain sizes may also be formed. Preferably, the second diamond mesa 33 is a single grain of diamond to enhance current conduction therethrough by minimizing grain boundaries.

Figure 2:
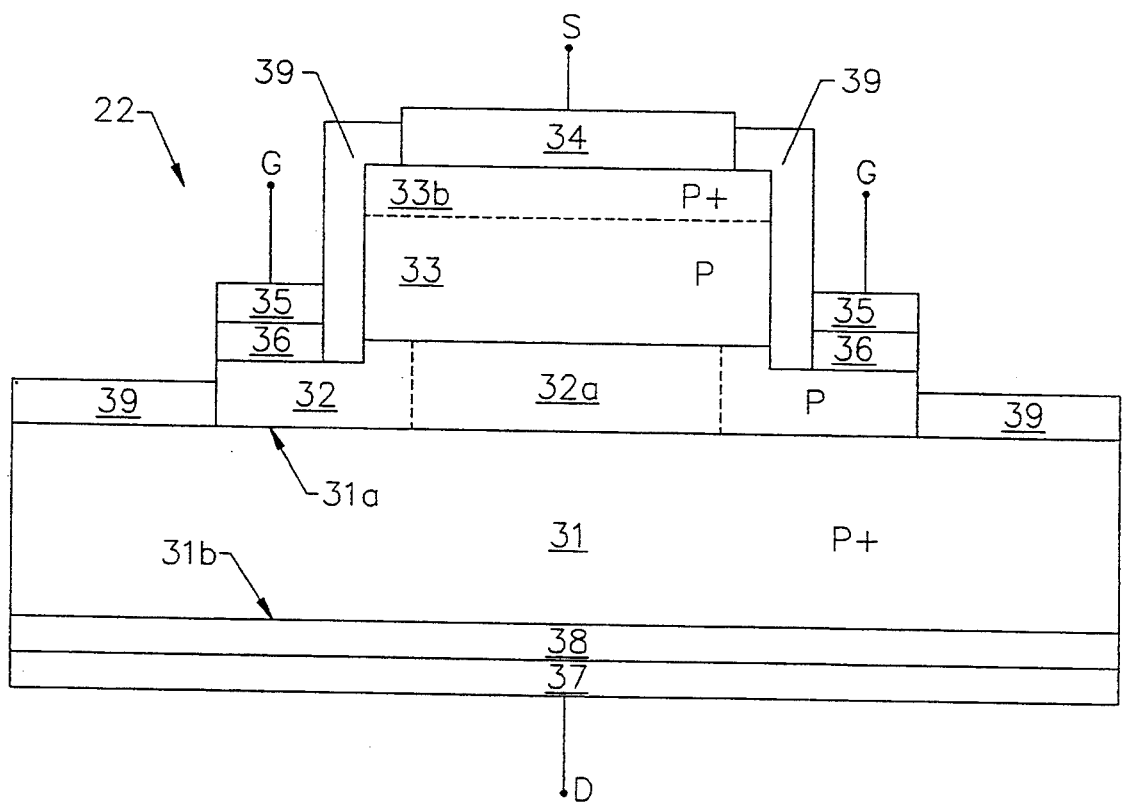
FIG. 2 is a cross-sectional side view of a second embodiment of a double diamond mesa vertical field effect transistor according to the present invention.

The double diamond mesa vertical field effect transistor 21 of FIG. 1 is particularly well suited for large scale integration because the source, gate and drain contacts 34, 35 and 37 respectively, are directly accessible on the top face 31a of diamond layer 31. Bottom face 31b of diamond layer 31 is free of source, drain and gate contacts, so that large scale integration of device 21 is facilitated. However, it will be understood by those having skill in the art that drain contact 37 may be formed on bottom face 31b of diamond layer 31 to provide a higher power handling discrete device. FIG. 2 illustrates a second embodiment of the double diamond mesa vertical field effect transistor 22 having a drain contact 37 formed on back face 31b of substrate 31. In this embodiment, substrate 31 is preferably a conductive substrate, and a separate drain contact 37 may not be necessary.

Figure 3:
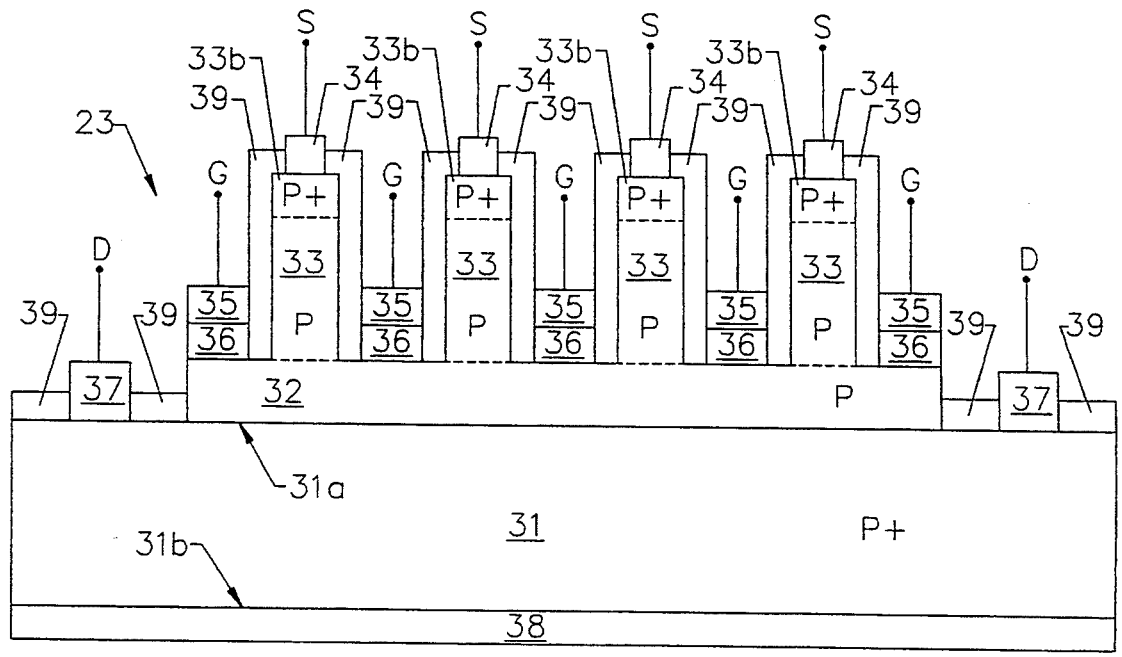
FIG. 3 is a cross-sectional side view of a third embodiment of a double diamond mesa vertical field effect transistor according to the present invention.
Figure 4:
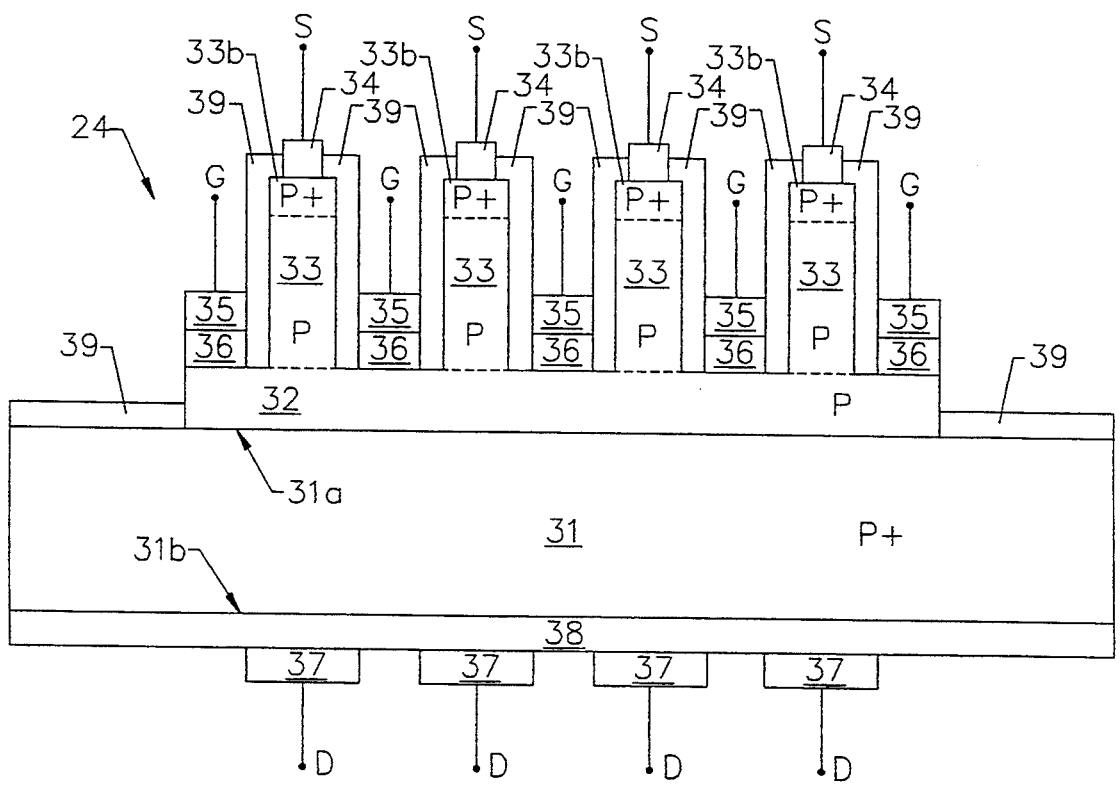
FIG. 4 is a cross-sectional side view of a fourth embodiment of a double diamond mesa vertical field effect transistor according to the present invention.

Referring now to FIG. 3, a third embodiment of the double diamond mesa field effect transistor 23 according to the present invention is described. In this embodiment, a plurality of second mesas 33 are formed on the first diamond mesa 32. Second mesas 33 include heavily doped top portions 33b. A plurality of gate contacts 35 are formed on the first diamond mesa 32, adjacent the second diamond mesas 33, and a source contact 34 is formed on each second diamond mesa 33. Each source contact 34 and gate contact 35 may be operated independently to form a plurality of vertical field effect transistors with a common drain contact 37. Alternatively, as shown in FIG. 4, a corresponding plurality of drain contacts 37 may be formed on the back face 31 of diamond substrate 31, so that a plurality of independent vertical field effect transistors are provided. When polycrystalline diamond second mesas 33 are provided, at least one, preferably many, and most preferably all of the source contacts 34 are narrower than the average polycrystalline diamond grain size. Also preferably, each second mesa 33 is formed of a single grain of diamond. Preferably, at least one or more, and most preferably all of the gate contacts 35 are narrower than the polycrystalline diamond grain size of polycrystalline first mesa 32. Accordingly, each vertical field effect transistor preferably operates across at most one grain boundary and, statistically, many of the transistors will be on only one grain and operate across no grain boundaries.

Figure 5:
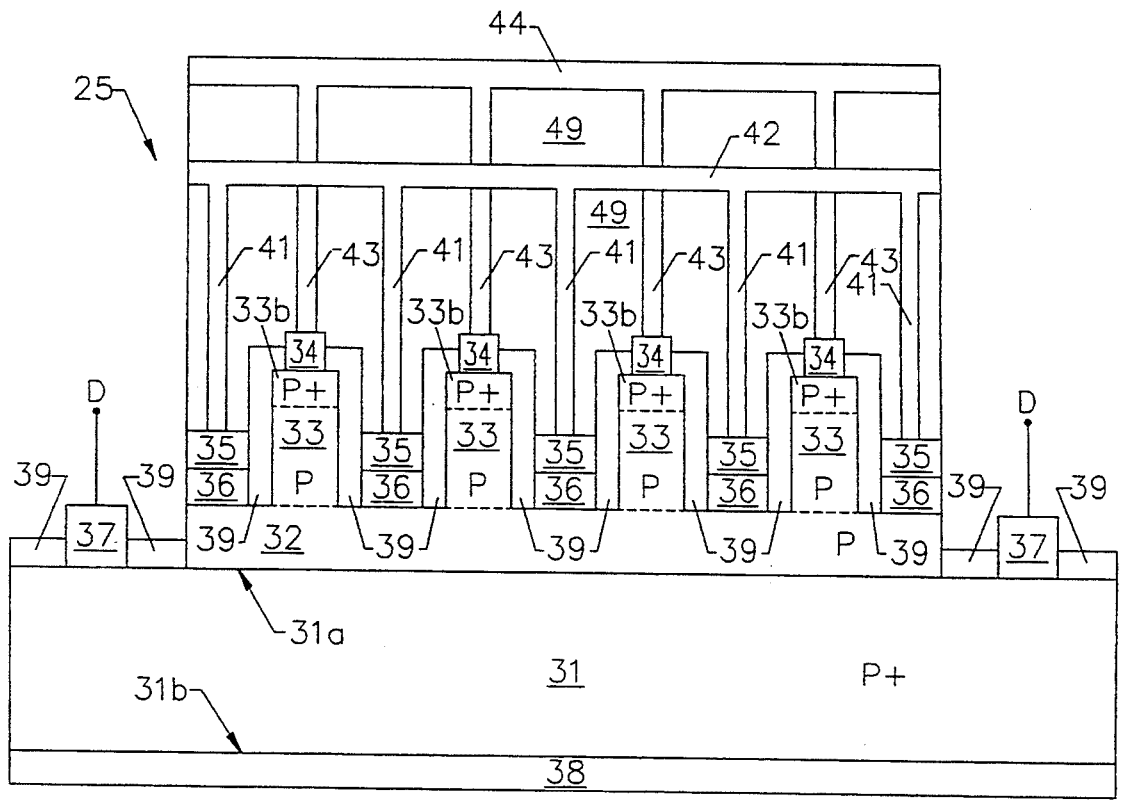
FIG. 5 is a cross-sectional side view of a fifth embodiment of a double diamond mesa vertical field effect transistor according to the present invention.

Referring now to FIG. 5, gate vias 41 may be used to electrically connect some or all of the gates 35 to a gate metallization layer 42, and source vias 43 may be used to connect some or all of the source contacts 34 to source metallization layer 44. The gate vias 41, gate metallization layer 42, source vias 43 and source metallization layer 44 are formed in an insulating layer 49. Accordingly, a power device 25, which is capable of handling high voltages and high currents, may be formed using a plurality of individual devices electrically connected in parallel.

Figure 6:
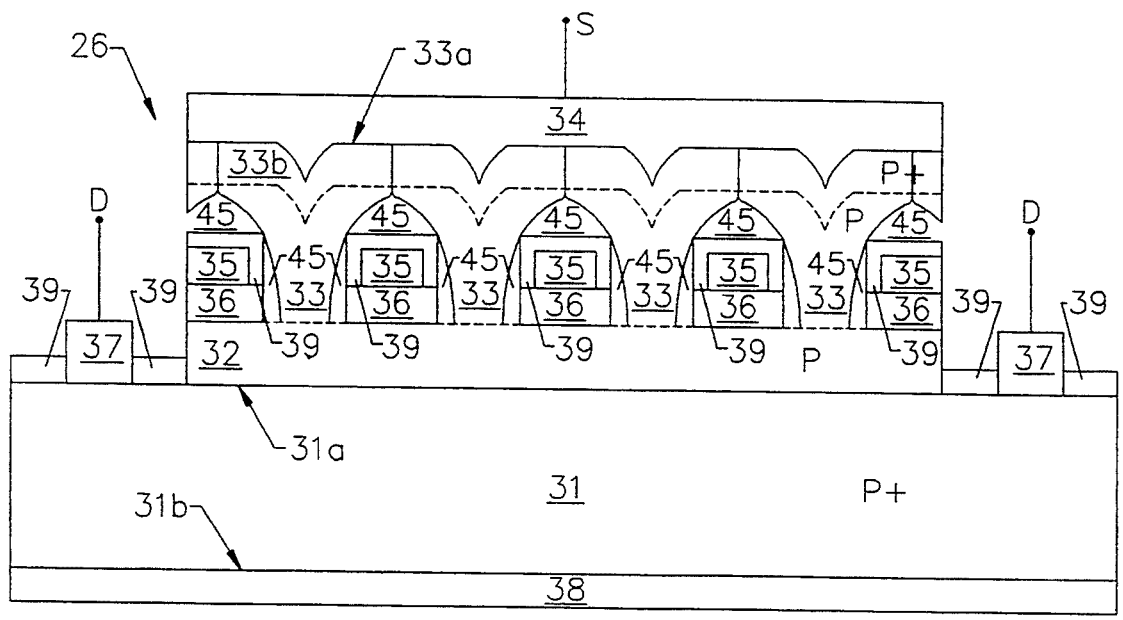
FIG. 6 is a cross-sectional side view of a sixth embodiment of a double diamond mesa vertical field effect transistor according to the present invention.
Figure 7:
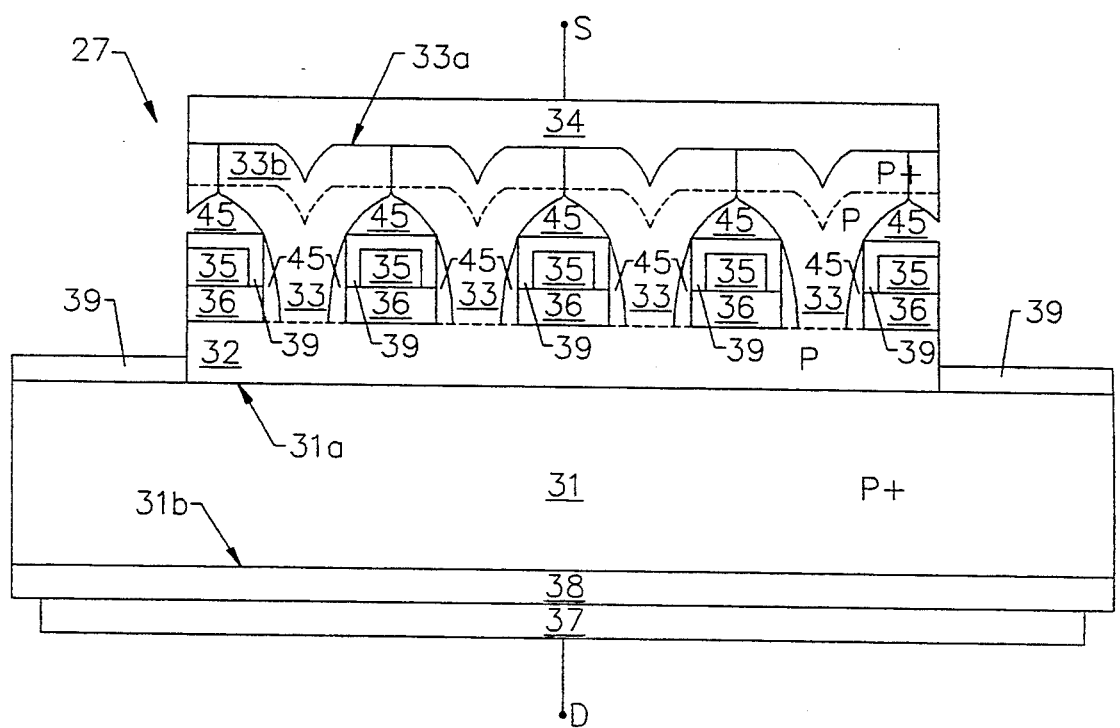
FIG. 7 is a cross-sectional side view of a seventh embodiment of a double diamond mesa vertical field effect transistor according to the present invention.

Referring now to FIG. 6, yet another embodiment of the vertical field effect transistor 26 of the present invention is illustrated. In this embodiment, the second diamond mesas 33 extend over gate contacts 35 to form a continuous top 33a of the second diamond mesas. A source contact 34 is formed on the continuous top of the second mesas. A heavily doped p+ layer 33b is formed at the top of second diamond mesa 33. Gate contacts 35 are surrounded by insulating layers, i.e. gate insulating layer 36 and passivating layer 39. It will be understood by those having skill in the art that gate insulating layer 36 and passivating layer 39 may be continuous. It will also be understood by those having skill in the art that voids 45 may be present between the second mesas 33 and the gate contacts 35. However, the gate electrode contact is made directly to layer 32, so that effective gate control is achieved. FIG. 7 illustrates an alternative embodiment of FIG. 6, wherein transistor 27 includes a drain contact 37 on the back face of substrate 31.

Figure 8A:
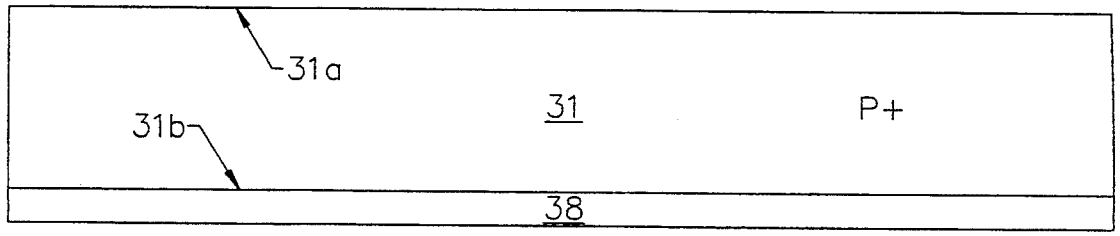
FIGS. 8A–8C are cross-sectional side views of the double diamond mesa vertical field effect transistors of FIGS. 1 and 2 during intermediate processing steps.
Figure 8B:
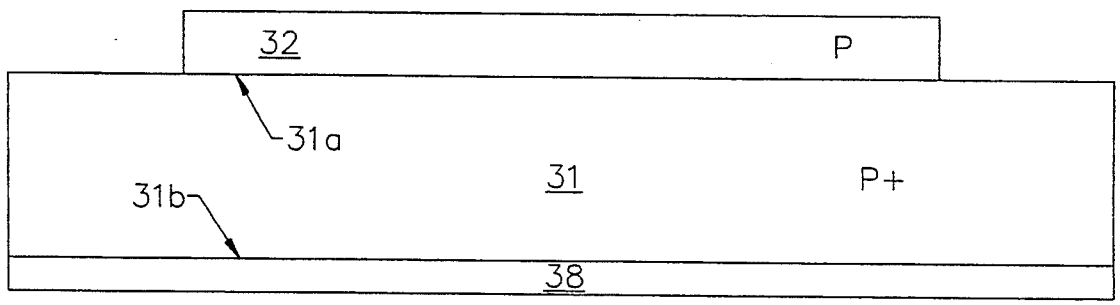
Figure 8C:
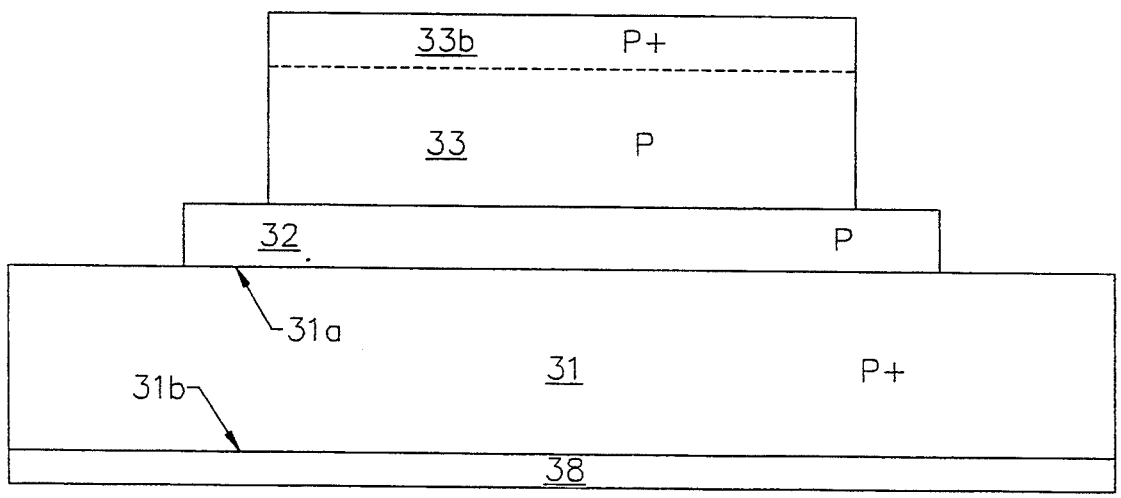

Referring now to FIGS. 8A–8C, a process for forming the double diamond mesa vertical field effect transistors 21 of FIG. 1 and 22 of FIG. 2 will now be described. As shown in FIG. 8A, a boron doped first diamond layer 31 is formed on nondiamond substrate 38, using well known techniques. As already described, to facilitate formation of a monocrystalline diamond layer 31, nondiamond substrate is preferably crystalline silicon carbide, cubic boron nitride, crystalline copper or crystalline nickel, preferably 200 $\mu$m–500 $\mu$m thick. Alternatively, in order to form a polycrystalline first diamond layer 31, nondiamond substrate 38 is preferably a low resistivity, less than about 0.001 $\omega$-cm monocrystalline silicon wafer, boron-doped at a concentration of $10^{19}$–$10^{20}$ atoms cm$^{-3}$. The substrate is preferably polished using well known silicon polishing techniques. Monocrystalline diamond layer 31 may be grown using a microwave chemical vapor deposition technique using CH$_4$ diluted in H$_2$ to 0.5 percent as a source gas, with B$_2$H$_6$ as a dopant gas, at a total gas pressure of 31.5 Torr and at substrate temperature of 800° C. It will also be understood by those having skill in the art that a buffer layer (not shown) of undoped diamond may also be included between substrate 38 and diamond layer Referring now to FIG. 8B, first diamond mesa 32 is formed on diamond layer 31. First diamond mesa is preferably lightly doped, i.e. at a boron doping concentration of about $10^{17}$–$10^{18}$ atoms cm$^{-3}$. First diamond mesa 32 may be formed by photolithographically defining a mask, such as a silicon dioxide mask (not shown) and then performing selective homoepitaxial growth of layer 32 on those portions of layer 31 which are exposed by the mask. Alternatively, a blanket diamond layer may be formed and then etched to define first mesa 32.

Referring now to FIG. 8C, second diamond mesa 33 is formed on first diamond mesa 32. Second diamond mesa 33 is preferably lightly doped, with a heavily doped top portion 33b. Second diamond mesa 33 may be formed by forming a mask on first diamond mesa 32 and selectively homoepitaxially growing second diamond mesa 33 on the exposed areas of first diamond mesa 32. Alternatively, a blanket layer may be homoepitaxially formed and etched to form second diamond mesa 33. After formation of the structure of FIG. 8C, source, drain and gate contacts may be formed to produce the structure of FIG. 1 or FIG. 2.

It will be understood by those having skill in the art that the top surface of diamond layer 31, first diamond mesa 32 and second diamond mesa 33 may preferably be polished to reduce the stress during subsequent epitaxial deposition. Polishing may be accomplished using the technique described in U.S. Pat. No. 4,643,161 to Kim entitled *Method of Machining Hard and Brittle Material*. Other polishing techniques may be used.

Source contact 34 may be fabricated by forming a refractory metal layer, preferably titanium of about 200 Å to about 400 Å thick, on second mesa 33. It will be understood by those having skill in the art that other refractory metals may also be used. A gold passivating layer, preferably about 1000 Å to about 1500 Å thick, may then be formed on the refractory metal layer. Other passivating layers may also be used. Then, an anneal is performed at about 800° C. to about 850° C. for a time period of about 15 minutes to about 90 minutes to convert at least a portion of the titanium layer to titanium carbide. A low resistance source contact is thereby formed. The process for forming the source contact as described above is similar to the process for forming ohmic contacts on diamond as described by Moazed et al. in *A Thermally Activated Solid State Reaction Process for Fabricating Ohmic Contacts to Semiconducting Diamond*, Applied Physics Journal, Vol. 68, No. 5, September 1990.

If desired, gate insulating layer 36 and passivating layer 39 may be formed of silicon dioxide and may be deposited by conventional techniques such as chemical vapor deposition or plasma enhanced chemical vapor deposition. Other gate insulating layers 36 including insulating diamond, silicon nitride and/or aluminum oxide may be used. Gate contact 35 may be formed of polycrystalline silicon or gold or other conventional conductor layers. Drain contact 37 may also be a conventional gold or other conductor layer. A suitable anneal may be then be performed.

Figure 9A:
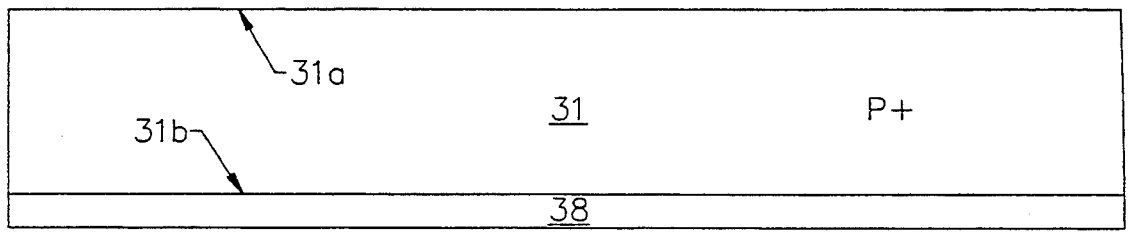
FIGS. 9A–9D are cross-sectional side views of the double diamond mesa vertical field effect transistors of FIGS. 3, 4 and 5 during intermediate processing steps.
Figure 9B:
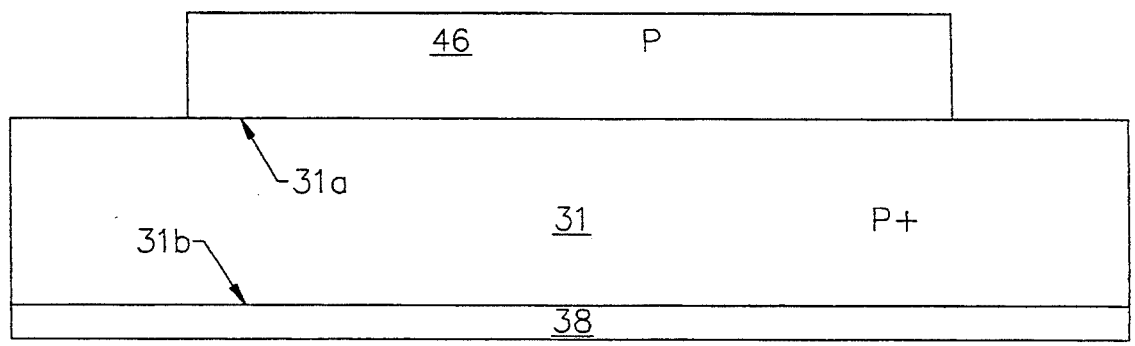
Figure 9C:
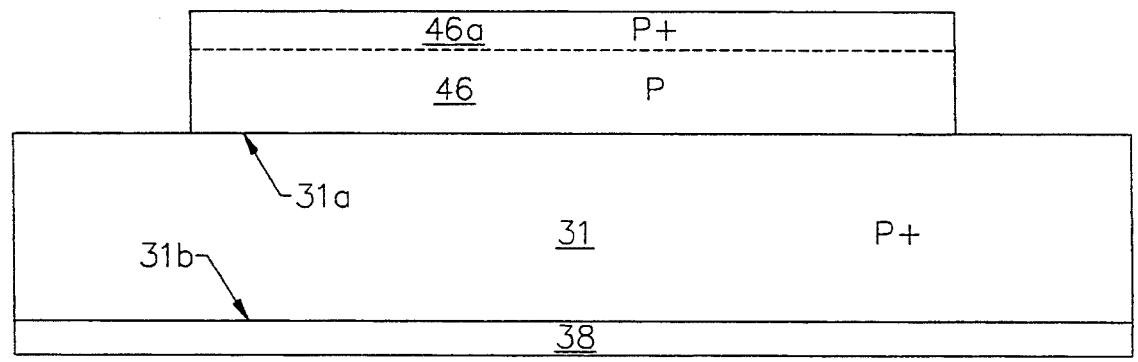

Referring now to FIGS. 9A-9D, a method for forming a double diamond mesa vertical field effect transistor 23 of FIG. 3, 24 of FIG. 4 or 25 of FIG. 5 will now be described. Referring to FIG. 9A, diamond layer 31 is formed as already described with respect to FIG. 8A. Then, referring to FIG. 9B, a second diamond layer 46, preferably lightly doped, is formed on diamond layer 31. A heavily doped portion 46a is then formed on the exposed face of layer 46, as shown in FIG. 9C. The heavily doped portion 46a may be formed by ion implantation or by epitaxial deposition or other known techniques. Diamond layer 31 is preferably about 0.5 μm to 5 μm thick and heavily doped portion 46a is preferably about 0.2 μm to 5 μm thick.

Figure 9D:
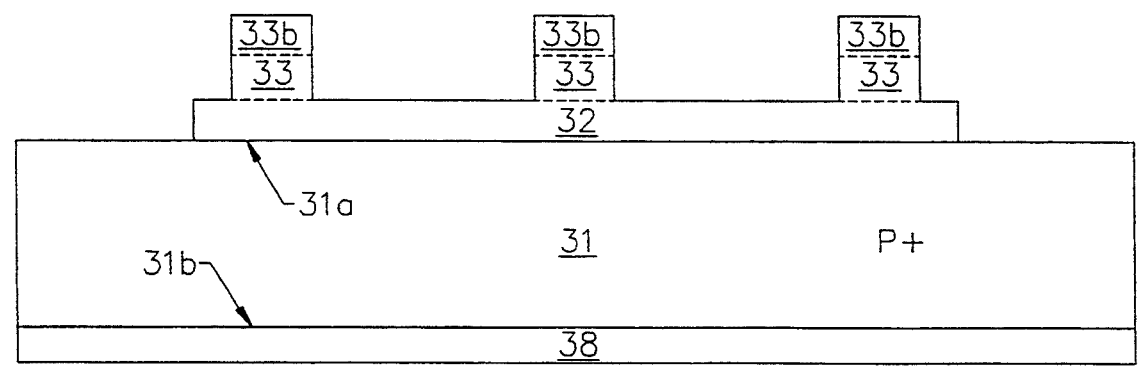

Then, referring to FIG. 9D, layers 46a and 46 are directionally etched to define the first mesa 32 and second mesa 33. Layers 46a and 46 may be directionally etched using techniques well known to those having skill in the art, such as electroncyclotron resonance (ECR), electron beam assisted etching, and chemically assisted ion beam etching (CAIBE). See the publications by Chan et al. entitled *Pattern Transfer Onto Carbon Films on Silicon Using Radio Frequency Oxygen Plasma Etching;* Rothschild et al. entitled *Excimer-Laser Etching of Diamond and Hard Carbon Films by Direct Writing and Optical Projection;* Kobashi et al. entitled *Microfabrication of Diamond Films: Selective Deposition and Etching;* and Beetz et al. entitled *ECR Plasma Etching of Natural Type IIa and Synthetic Diamonds*. As shown, first mesa 32 is lightly doped and second mesa 33 is lightly doped with a heavily doped portion 33b at the top surface thereof. Contact formation then proceeds as already described to form the structures of FIGS. 3, 4 or 5.

Figure 10A:
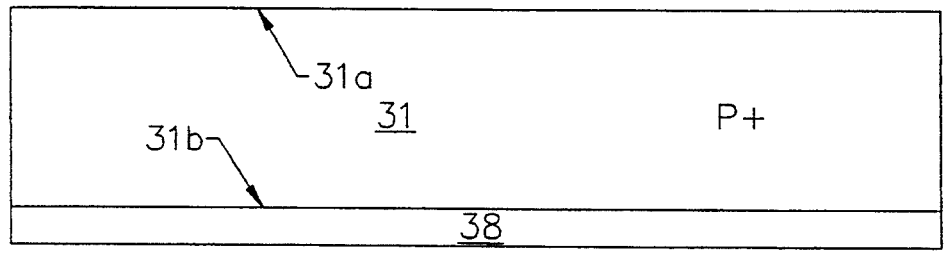
FIGS. 10A–10H are cross-sectional side views of the double diamond mesa vertical field effect transistors of FIGS. 6 and 7 during intermediate processing steps.
Figure 10B:
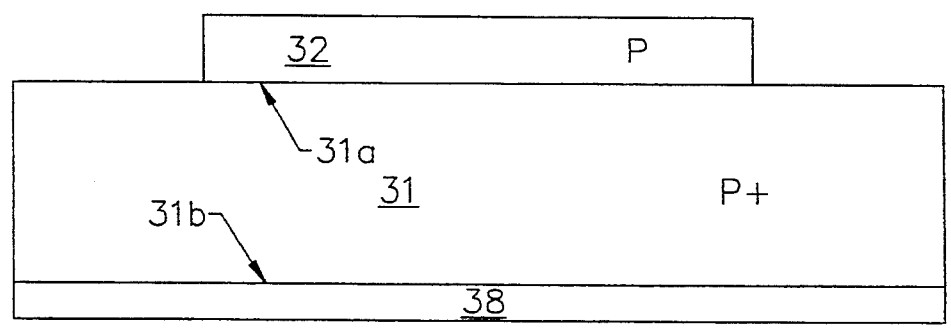
Figure 10C:
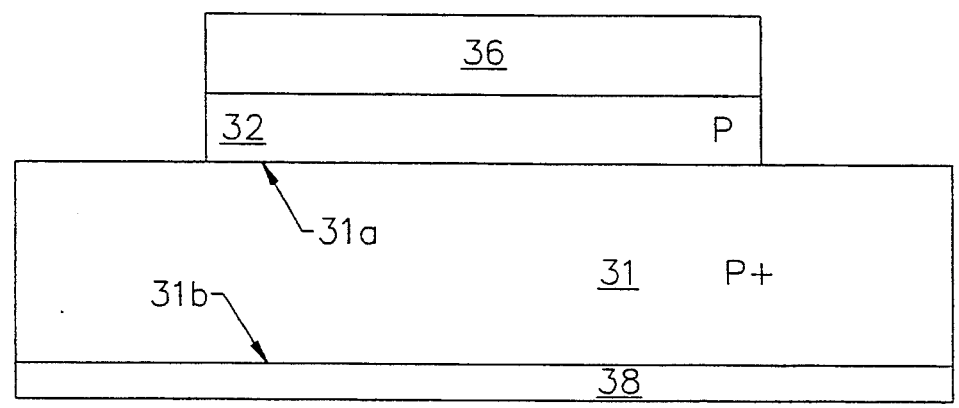
Figure 10D:
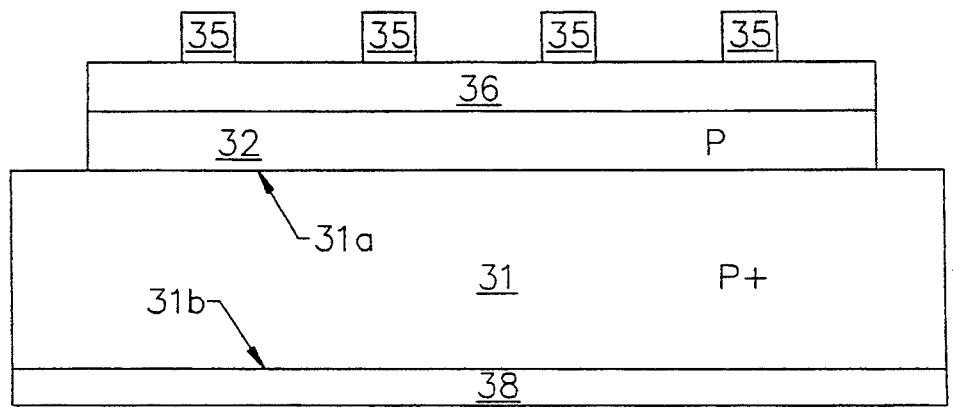
Figure 10E:
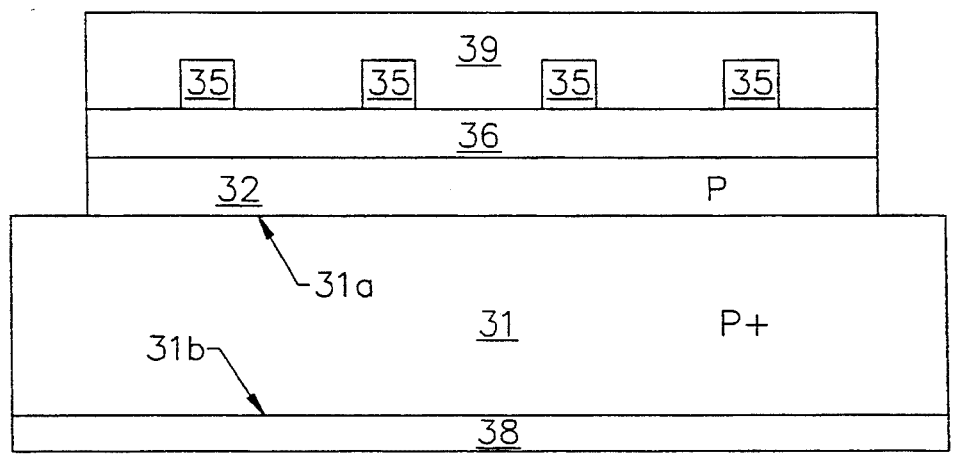
Figure 10F:
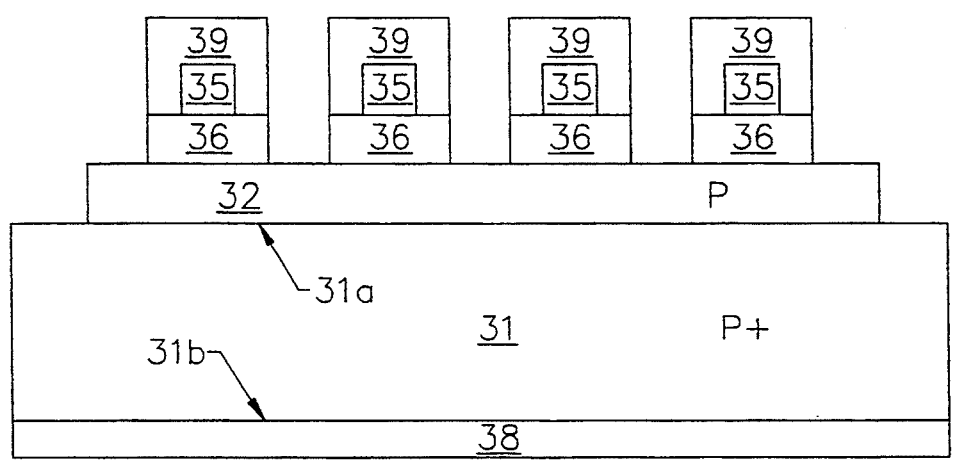

Referring now to FIGS. 10A-10H a process for forming the double diamond mesa vertical field effect transistor 26 of FIG. 6 and 27 of FIG. 7 will now be described. FIGS. 10A and 10B correspond to FIGS. 8A and 8B respectively. Referring to FIG. 10C, gate insulating layer 36, such as a silicon dioxide layer about 100 Å to about 1000 Å thick is photolithographically patterned on the first diamond mesa 32. As shown in FIG. 10D, gate contact 35 is then formed and patterned on gate insulating layer 36. Then, as shown in FIG. 10E, encapsulating layer 39 is formed on the sides and tops of gate contacts 35. Encapsulating layer 39 is preferably silicon dioxide and forms a continuous silicon dioxide layer, along with layer 36, surrounding gate contacts 35. Then, as shown in FIG. 10F, the structure is etched to form discrete encapsulated gate contacts.

Figure 10G:
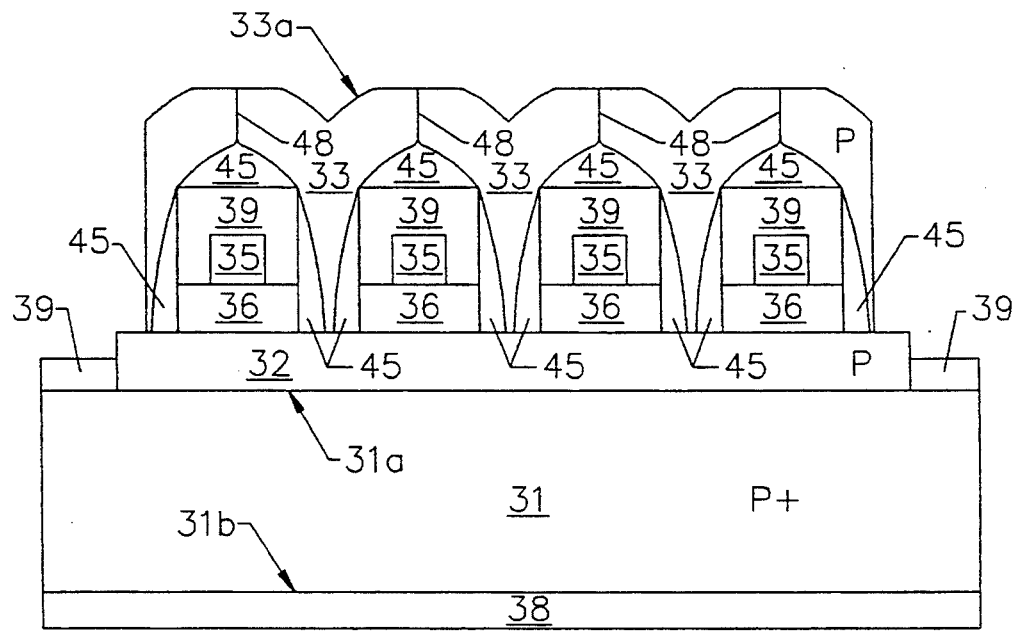

Referring to FIG. 10G, second mesa 33 is grown on first mesa 32 between gate insulating layer 36 and gate contacts 35 and extending over gate contacts 35, using a diamond overgrowth process as described in a publication by Jaworske et al. entitled *Construction and Characterization of a Diamond Thin Film Anemometer*, Proceedings of the Second International Symposium on Diamond Materials, Vol. 91-8, pp. 608-614. Encapsulating layer 39 prevents the gate contacts 35 from shorting with second mesa 33. The diamond overgrowth process produces polycrystalline grains which grow over gate contacts 35 until the grain boundaries 48 contact one another. A continuous top layer 33a is thereby formed on second diamond mesas 33. In order to form a continuous top layer 33a, the width and height of regions 36 and 39 must be sufficiently small to allow the overgrowth to merge. It will be understood by those having skill in the art that this process will typically produce voids 45 adjacent the gate contact, but these voids minimally impact the device performance. Other diamond overgrowth processes may be used.

Figure 10H:
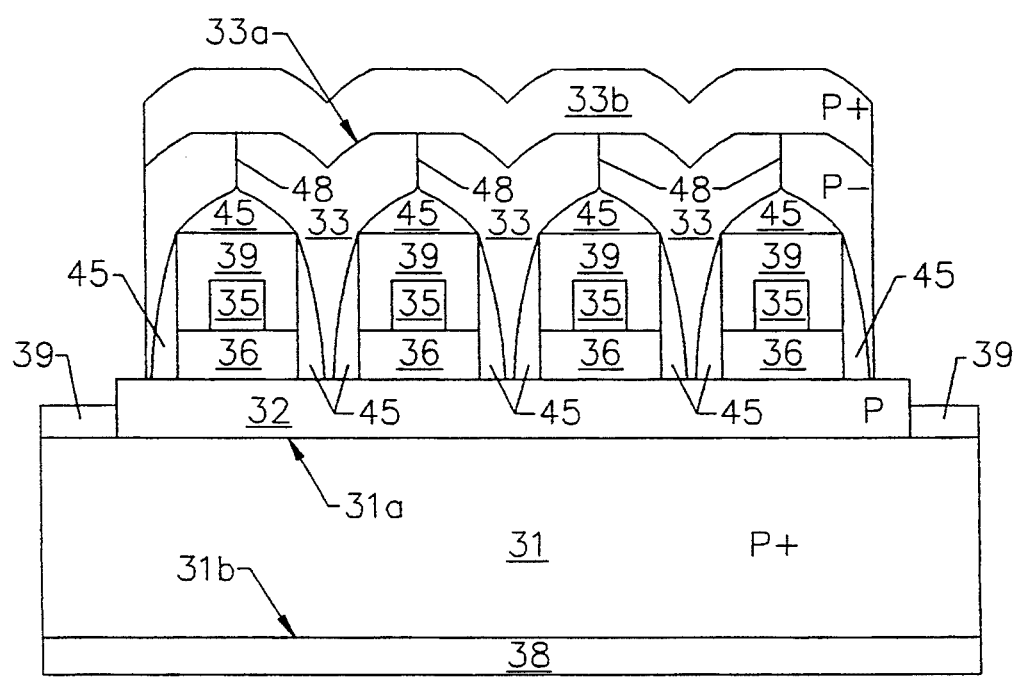

Then, referring to FIG. 10H, a heavily doped portion 33b is formed in the continuous top layer 33a of mesas 33, either by ion implantation or by in situ doping. Source and drain contacts may then be formed to produce the structures of FIGS. 6 or 7. Accordingly, this process eliminates the need for source vias because a single source contact is formed.

Referring now to FIGS. 11A-11H, an alternative process for forming the transistors of FIGS. 3, 4 or 5 is illustrated. This process is similar to the process already described with respect to FIG. 10, except the size of regions 36 and 39 are sufficiently large, so that the lateral overgrowth of second diamond mesa 33 does not form a continuous top surface.

Figure 11A:
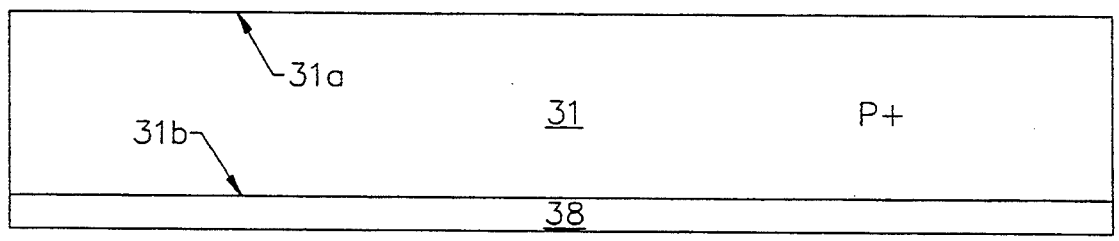
FIGS. 11A–11H are cross-sectional side views of the double diamond mesa vertical field effect transistors of FIGS. 3, 4 and 5 during a second embodiment of intermediate processing steps.
Figure 11B:
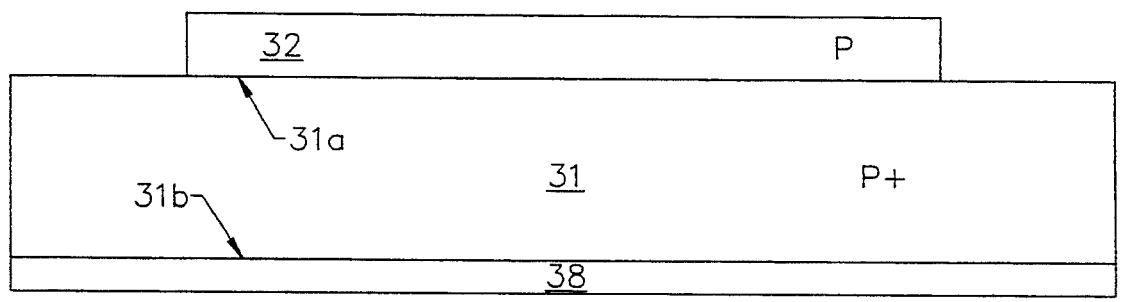
Figure 11C:
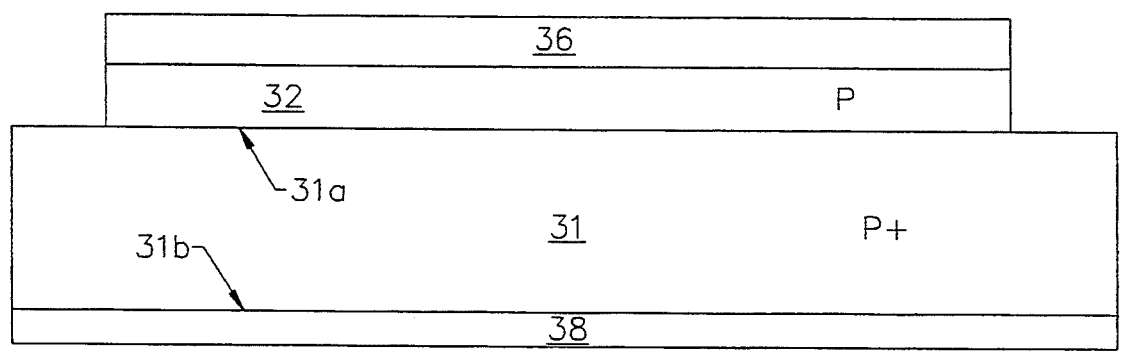
Figure 11D:
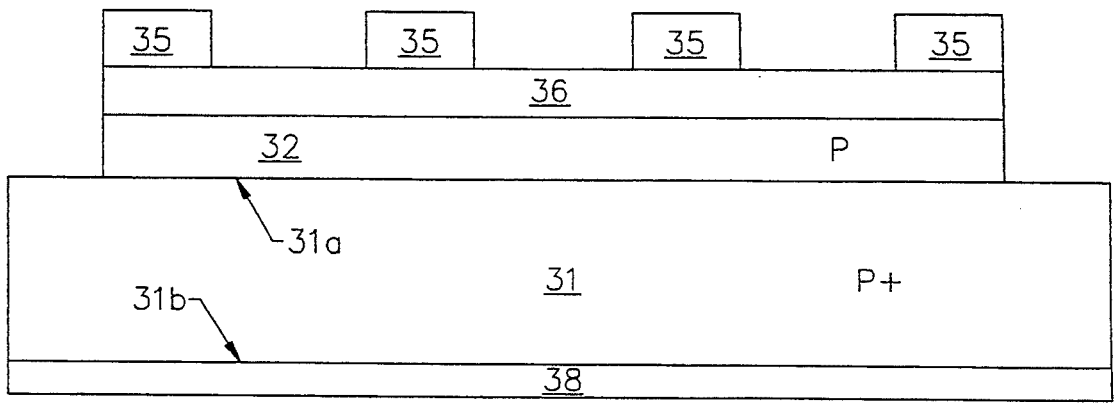
Figure 11E:
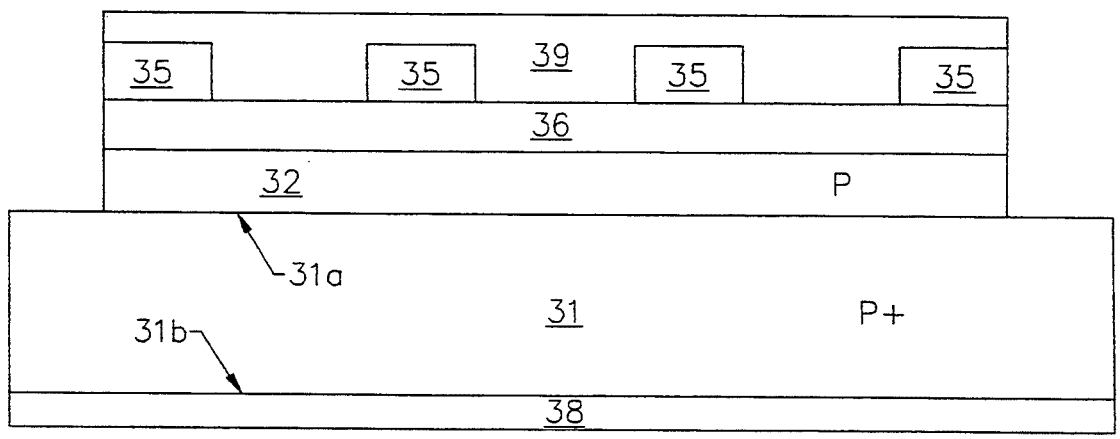
Figure 11F:
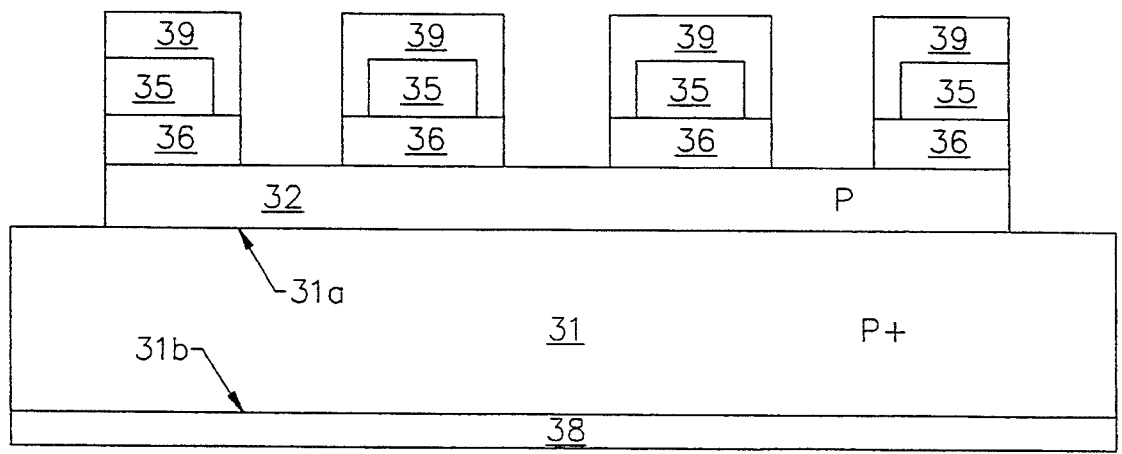
Figure 11G:
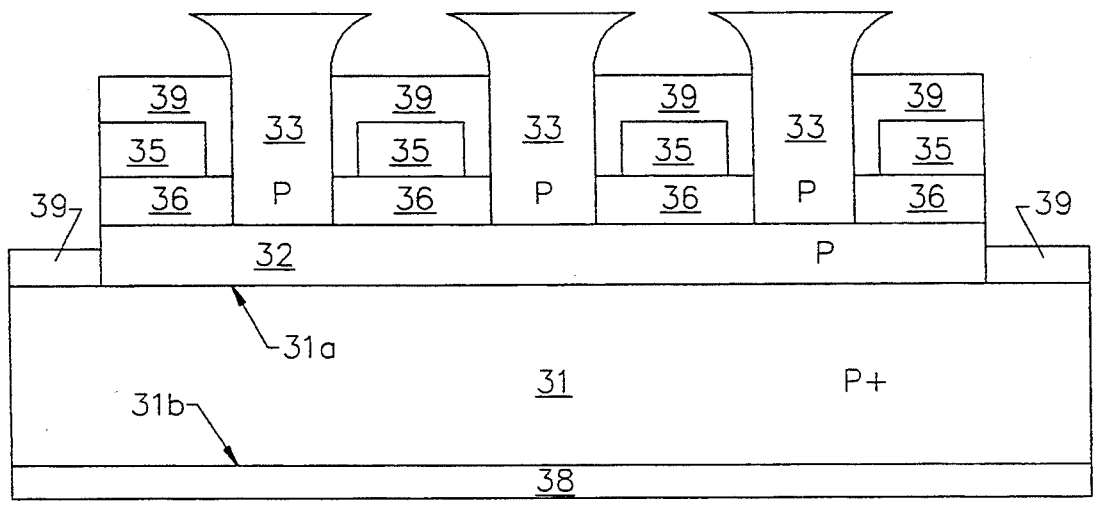
Figure 11H:
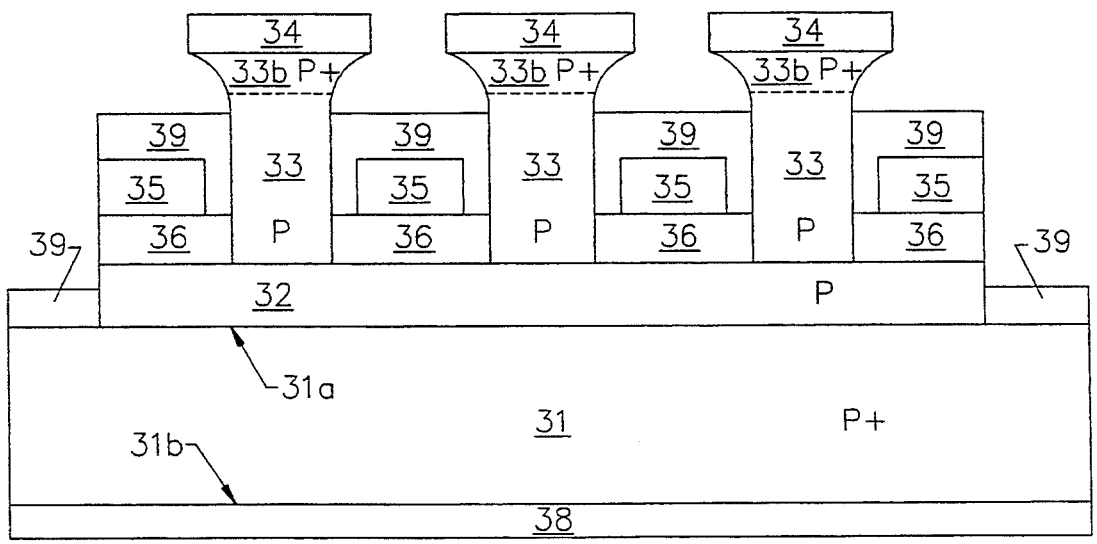

FIGS. 11A–11F correspond to FIGS. 10A–10F except for the aforementioned larger size regions. As shown in FIG. 11G, polycrystalline diamond overgrowth produces isolated diamond grains to form isolated second mesas 33. Individual source contacts 34 are then formed and the device is completed to produce the device of FIGS. 3 or 4.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A vertical field effect transistor comprising:
   a diamond layer having a face;
   a first diamond mesa on said face of said diamond layer;
   a second diamond mesa on said first diamond mesa opposite said face of said diamond layer;
   a source contact on said second diamond mesa opposite said first diamond mesa;
   a drain contact on said face of said diamond layer, said source and drain contacts defining a vertical channel for carrier conduction through said first diamond mesa; and
   a gate on said first diamond mesa, opposite said face of said diamond layer;
   wherein said diamond layer comprises a heavily doped diamond layer of predetermined conductivity type, wherein said first diamond mesa comprises a lightly doped first diamond mesa of said predetermined conductivity type and forms said vertical channel, and wherein said second diamond mesa includes a heavily doped region of said predetermined conductivity type.

2. The vertical field effect transistor of claim 1 further comprising:
   a third diamond mesa on said first diamond mesa, opposite said face of said diamond layer and adjacent said second diamond mesa;
   a second source contact on said third diamond mesa opposite said first diamond mesa, said second source contact and said drain contact defining a second vertical channel through said first diamond mesa; and
   a second gate on said first diamond mesa, between said second and third diamond mesas.

3. The vertical field effect transistor of claim 2 further comprising means for electrically connecting said source contact and said second source contact.

4. The vertical field effect transistor of claim 3 wherein said means for electrically connecting said source contact and said second source contact comprises:
   a first conductor filled source via electrically connected to said source contact;
   a second conductor filled source via electrically connected to said second source contact; and
   a source contact bus electrically connected to said first and second conductor filled source vias.

5. The vertical field effect transistor of claim 3 further comprising means for electrically connecting said gate and said second gate.

6. The vertical field effect transistor of claim 5 wherein said means for electrically connecting said gate and said second gate comprises:
   a first conductor filled gate via electrically connected to said gate;
   a second conductor filled gate via electrically connected to said second gate; and
   a gate contact bus electrically connected to said first and second gate vias.

7. The vertical field effect transistor of claim 1 wherein said source contact comprises a refractory metal layer on said second diamond mesa and a nonrefractory metal layer on said refractory metal layer.

8. The vertical field effect transistor of claim 1 wherein said vertical field effect transistor is a junction field effect transistor.

9. The vertical field effect transistor of claim 1 wherein said diamond layer is a monocrystalline diamond layer, wherein said first diamond mesa is a homoepitaxial first diamond mesa, and wherein said second diamond mesa is a homoepitaxial second diamond mesa.

10. A vertical field effect transistor comprising:
    a diamond layer having a face;
    a first diamond mesa on said face of said diamond layer;
    a second diamond mesa on said first diamond mesa opposite said face of said diamond layer;
    a source contact on said second diamond mesa opposite said first diamond mesa;
    a drain contact on said face of said diamond layer, said source and drain contacts defining a vertical channel for carrier conduction through said first diamond mesa; and
    a gate on said first diamond mesa, opposite said face of said diamond layer;
    wherein said diamond layer is a polycrystalline diamond layer, wherein said first diamond mesa is a polycrystalline first diamond mesa, and wherein said second diamond mesa is a single grain of diamond.

11. The vertical field effect transistor of claim 10 further comprising a nondiamond substrate on said diamond layer, opposite said face of said diamond layer.

12. The vertical field effect transistor of claim 11 wherein said nondiamond substrate comprises a monocrystalline silicon substrate.

13. The vertical field effect transistor of claim 11 wherein said nondiamond substrate is selected from the group consisting of crystalline silicon carbide, cubic boron nitride, crystalline copper and crystalline nickel.

14. A vertical field effect transistor comprising:
    a diamond layer having a face;
    a first diamond mesa on said face of said diamond layer;
    a second diamond mesa on said first diamond mesa opposite said face of said diamond layer;
    a source contact on said second diamond mesa opposite said first diamond mesa;
    a drain contact on said face of said diamond layer, said source and drain contacts defining a vertical channel for carrier conduction through said first diamond mesa;
    a gate on said first diamond mesa, opposite said face of said diamond layer;

a third diamond mesa on said first diamond mesa, opposite said face of said diamond layer and adjacent said second diamond mesa;

a second gate on said first diamond mesa, between said second and third diamond mesas; and a diamond layer extending laterally over said second and third diamond mesas and said second gate to define a continuous top surface of diamond electrically connected to said second and third diamond mesas opposite said first diamond mesa, said source contact being on said continuous top surface of diamond.

15. A vertical field effect transistor comprising:

a diamond layer having a face;

a diamond mesa on said face of said diamond layer;

a source contact adjacent said diamond mesa, opposite said face of said diamond layer;

a drain contact on said face of said diamond layer, said source and drain contacts defining a vertical channel through said diamond mesa; and a gate on said diamond mesa;

wherein said diamond layer comprises a heavily doped diamond layer of predetermined conductivity type, and wherein said diamond mesa comprises a lightly doped first diamond mesa of said predetermined conductivity type and forms said vertical channel.

16. The vertical field effect transistor of claim 15 further comprising a second source contact adjacent said diamond mesa, opposite said face of said diamond layer, and a second gate on said diamond mesa, said second source contact and said drain contact defining a second vertical channel through said diamond mesa.

17. The vertical field effect transistor of claim 16 further comprising means for electrically connecting said source contact and said second source contact.

18. The vertical field effect transistor of claim 17 wherein said means for electrically connecting said source contact and said second source contact comprises:

a first conductor filled source via electrically connected to said source contact;

a second conductor filled source via electrically connected to said second source contact; and a source contact bus electrically connected to said first and second source vias.

19. The vertical field effect transistor of claim 17 further comprising means for electrically connecting said gate and said second gate.

20. The vertical field effect transistor of claim 19 wherein said means for electrically connecting said gate and said second gate comprises:

a first conductor filled gate via electrically connected to said gate;

a second conductor filled gate via electrically connected to said second gate; and a gate contact bus electrically connected to said first and second conductor filled gate vias.

21. The vertical field effect transistor of claim 15 wherein said source contact comprises a refractory metal layer adjacent said diamond mesa and a nonrefractory metal layer on said refractory metal layer.

22. The vertical field effect transistor of claim 15 wherein said gate comprises a gate insulating layer on said diamond mesa and a gate contact on said gate insulating layer.

23. The vertical field effect transistor of claim 15 further comprising a nondiamond substrate on said diamond layer, opposite said face of said diamond layer.

24. The vertical field effect transistor of claim 23 wherein said nondiamond substrate comprises a monocrystalline silicon substrate.

25. The vertical field effect transistor of claim 23 wherein said nondiamond substrate is selected from the group consisting of crystalline silicon carbide, cubic boron nitride, crystalline copper and crystalline nickel.

26. A vertical field effect transistor comprising:

a nondiamond substrate including a drain contact;

a diamond layer on said nondiamond substrate;

a first diamond mesa on said diamond layer, opposite said nondiamond substrate;

a second diamond mesa on said first diamond mesa opposite said diamond layer;

a source contact on said second diamond mesa opposite said first diamond mesa, said source and drain contacts defining a vertical channel for carrier conduction through said first diamond mesa; and a gate on said first diamond mesa, opposite said diamond layer;

wherein said diamond layer is a polycrystalline diamond layer, wherein said first diamond mesa is a polycrystalline first diamond mesa, and wherein said second diamond mesa is a single grain of diamond.

27. The vertical field effect transistor of claim 26 wherein said nondiamond substrate includes said drain contact opposite said diamond layer.

28. The vertical field effect transistor of claim 26 wherein said diamond layer comprises a heavily doped diamond layer of predetermined conductivity type, wherein said first diamond mesa comprises a lightly doped first diamond mesa of said predetermined conductivity type and forms said vertical channel, and wherein said second diamond mesa includes a heavily doped region of said predetermined conductivity type.

29. The vertical field effect transistor of claim 26 further comprising:

a third diamond mesa on said first diamond mesa, opposite said diamond layer and adjacent said second diamond mesa;

a second source contact on said third diamond mesa opposite said first diamond mesa, said second source contact and said drain contact defining a second vertical channel through said first diamond mesa; and a second gate on said first diamond mesa, between said second and third diamond mesas.

30. The vertical field effect transistor of claim 26 further comprising:

a third diamond mesa on said first diamond mesa, opposite said diamond layer and adjacent said second diamond mesa;

a second source contact on said third diamond mesa opposite said first diamond mesa;

said nondiamond substrate including a second drain contact, said drain contact being opposite said source contact and said second drain contact being opposite said second source contact, said second source contact and said second-drain contact defining a second vertical channel through said first diamond mesa; and a second gate on said first diamond mesa, between said second and third diamond mesas.

31. The vertical field effect transistor of claim 29 further comprising means for electrically connecting said source contact and said second source contact.

32. The vertical field effect transistor of claim 31 wherein said means for electrically connecting said source contact and said second source contact comprises:
a first conductor filled source via electrically connected to said source contact;
a second conductor filled source via electrically connected to said second source contact; and
a source contact bus electrically connected to said first and second conductor filled source vias.

33. The vertical field effect transistor of claim 31 further comprising means for electrically connecting said gate and said second gate.

34. The vertical field effect transistor of claim 33 wherein said means for electrically connecting said gate and said second gate comprises:
a first conductor filled gate via electrically connected to said gate;
a second conductor filled gate via electrically connected to said second gate; and
a gate contact bus electrically connected to said first and second conductor filled gate vias.

35. The vertical field effect transistor of claim 26 wherein said source contact comprises a refractory metal layer on said second diamond mesa and a nonrefractory metal layer on said refractory metal layer.

36. The vertical field effect transistor of claim 26 wherein said vertical field effect transistor is a junction field effect transistor.

37. The vertical field effect transistor of claim 26 wherein said diamond layer is a monocrystalline diamond layer, wherein said first diamond mesa is a homoepitaxial first diamond mesa, and wherein said second diamond mesa is a homoepitaxial second diamond mesa.

38. The vertical field effect transistor of claim 26 wherein said nondiamond substrate comprises a monocrystalline silicon substrate.

39. The vertical field effect transistor of claim 26 wherein said nondiamond substrate is selected from the group consisting of crystalline silicon carbide, cubic boron nitride, crystalline copper and crystalline nickel.

40. The vertical field effect transistor of claim 26 further comprising:
a third diamond mesa on said first diamond mesa, opposite said diamond layer and adjacent said second diamond mesa;
a second gate on said first diamond mesa, between said second and third diamond mesas;
a diamond layer extending laterally over said second and third diamond mesas and said second gate to define a continuous top surface of diamond electrically connected to said second and third diamond mesas opposite said first diamond mesa, said source contact being on said continuous top surface of diamond.

41. A vertical field effect transistor comprising:
a diamond layer having a face;
a first diamond mesa on said face of said diamond layer;
a plurality of second diamond mesas on said first diamond mesa opposite said face of said diamond layer;
a source contact on each of said second diamond mesas opposite said first diamond mesa;
a drain contact on said face of said diamond layer, said source and drain contacts defining a plurality of vertical channels for carrier conduction through said first diamond mesa; and
a plurality of gates on said first diamond mesa, opposite said face of said diamond layer, a respective gate being located between adjacent second mesas;
wherein said diamond layer is a polycrystalline diamond layer, wherein said first diamond mesa is a polycrystalline first diamond mesa, and wherein said plurality of second diamond mesas are each a single grain of diamond.

42. The vertical field effect transistor of claim 41 wherein said diamond layer comprises a heavily doped diamond layer of predetermined conductivity type, wherein said first diamond mesa comprises a lightly doped first diamond mesa of said predetermined conductivity type and forms said vertical channels, and wherein said plurality of second diamond mesas each include a heavily doped region of said predetermined conductivity type.

43. The vertical field effect transistor of claim 41 further comprising means for electrically connecting said plurality of source contacts.

44. The vertical field effect transistor of claim 43 wherein said means for electrically connecting said plurality of source contacts comprises:
a plurality of conductor filled source vias, a respective one of which is electrically connected to a respective source contact; and
a source contact bus electrically connected to said plurality of conductor filled source vias.

45. The vertical field effect transistor of claim 44 further comprising means for electrically connecting said plurality of gates.

46. The vertical field effect transistor of claim 45 wherein said means for electrically connecting said plurality of gates comprises:
a plurality of conductor filled gate vias, a respective one of which is electrically connected to a respective gate; and
a gate contact bus electrically connected to said plurality of conductor filled gate vias.

47. The vertical field effect transistor of claim 41 wherein each of said source contacts comprises a refractory metal layer on said second diamond mesa and a nonrefractory metal layer on said refractory metal layer.

48. The vertical field effect transistor of claim 41 wherein said vertical field effect transistor is a junction field effect transistor.

49. The vertical field effect transistor of claim 41 wherein said diamond layer is a monocrystalline diamond layer, wherein said first diamond mesa is a homoepitaxial first diamond mesa, and wherein said plurality of second diamond mesas are a plurality of homoepitaxial second diamond mesas.

50. The vertical field effect transistor of claim 41 further comprising a nondiamond substrate on said diamond layer, opposite said face of said diamond layer.

51. The vertical field effect transistor of claim 50 wherein said nondiamond substrate comprises a monocrystalline silicon substrate.

52. The vertical field effect transistor of claim 50 wherein said nondiamond substrate is selected from the group consisting of crystalline silicon carbide, cubic boron nitride, crystalline copper and crystalline nickel.

53. A vertical field effect transistor comprising:

a nondiamond substrate including a drain contact;
a diamond layer on said nondiamond substrate;
a first diamond mesa on said diamond layer, opposite said nondiamond substrate;
a plurality of second diamond mesas on said first diamond mesa opposite said diamond layer;
a source contact on each of said second diamond mesas opposite said first diamond mesa, said source and drain contacts defining a plurality of vertical channels for carrier conduction through said first diamond mesa; and
a plurality of gates on said first diamond mesa, opposite said diamond layer, a respective gate being located between adjacent second mesas;
wherein said diamond layer comprises a heavily doped diamond layer of predetermined conductivity type, wherein said first diamond mesa comprises a lightly doped first diamond mesa of said predetermined conductivity type and forms said vertical channels, and wherein said plurality of second diamond mesas each include a heavily doped region of said predetermined conductivity type.

54. The vertical field effect transistor of claim 53 wherein said nondiamond substrate includes said drain contact opposite said diamond layer.

55. The vertical field effect transistor of claim 53 wherein said nondiamond substrate includes a plurality of drain contacts therein, a respective one of which is opposite a respective one of said source contacts.

56. The vertical field effect transistor of claim 53 wherein said nondiamond substrate includes a plurality of drain contacts thereon, opposite said diamond layer, a respective one of which is opposite a respective one of said source contacts.

57. The vertical field effect transistor of claim 53 further comprising means for electrically connecting said plurality of source contacts.

58. The vertical field effect transistor of claim 57 wherein said means for electrically connecting said plurality of source contacts comprises:
a plurality of conductor filled source vias, a respective one of which is electrically connected to a respective source contact; and
a source contact bus electrically connected to said plurality of conductor filled source vias.

59. The vertical field effect transistor of claim 58 further comprising means for electrically connecting said plurality of gates.

60. The vertical field effect transistor of claim 59 wherein said means for electrically connecting said plurality of gates comprises:
a plurality of conductor filled gate vias, a respective one of which is electrically connected to a respective gate; and
a gate contact bus electrically connected to said plurality of conductor filled gate vias.

61. The vertical field effect transistor of claim 53 wherein each of said source contacts comprises a refractory metal layer on said second diamond mesa and a nonrefractory metal layer on said refractory metal layer.

62. The vertical field effect transistor of claim 53 wherein said vertical field effect transistor comprises a junction vertical field effect transistor.

63. The vertical field effect transistor of claim 53 wherein said diamond layer is a monocrystalline diamond layer, wherein said first diamond mesa is a homoepitaxial first diamond mesa, and wherein each of said second diamond mesas is a homoepitaxial second diamond mesa.

64. The vertical field effect transistor of claim 53 wherein said diamond layer is a polycrystalline diamond layer, wherein said first diamond mesa is a polycrystalline first diamond mesa, and wherein each of said second diamond mesas is a single grain of diamond.

65. The vertical field effect transistor of claim 53 wherein said nondiamond substrate comprises a monocrystalline silicon substrate.

66. The vertical field effect transistor of claim 53 wherein said nondiamond substrate is selected from the group consisting of crystalline silicon carbide, cubic boron nitride, crystalline copper and crystalline nickel.

67. A vertical field effect transistor comprising:
a diamond layer having a face;
a first diamond mesa on said face of said diamond layer;
a plurality of second diamond mesas on said first diamond mesa opposite said face of said diamond layer;
a plurality of gates on said first diamond mesa, opposite said face of said diamond layer, a respective gate being located between adjacent second mesas;
a diamond layer extending laterally over said plurality of second diamond mesas and said gates to define a continuous top surface of diamond electrically connected to said plurality of second diamond mesas opposite said first diamond mesa;
a common source contact on said continuous top surface of diamond; and
at least one drain contact electrically connected to said diamond layer, said common source contact and said at least one drain contact defining a plurality of vertical channels through said first diamond mesa.

68. The vertical field effect transistor of claim 67 wherein said diamond layer comprises a heavily doped diamond layer of predetermined conductivity type, wherein said first diamond mesa comprises a lightly doped first diamond mesa of said predetermined conductivity type and forms said vertical channels, and wherein said plurality of second diamond mesas each include a heavily doped region of said predetermined conductivity type.

69. The vertical field effect transistor of claim 67 wherein said common source contact comprises a refractory metal layer on said second diamond mesa and a nonrefractory metal layer on said refractory metal layer.

70. The vertical field effect transistor of claim 67 wherein each of said gates comprises a gate insulating layer on said first diamond mesa and a gate contact on said gate insulating layer.

71. The vertical field effect transistor of claim 67 wherein said diamond layer is a monocrystalline diamond layer, wherein said first diamond mesa is a homoepitaxial first diamond mesa, and wherein said plurality of second diamond mesas are a plurality of homoepitaxial second diamond mesas.

72. The vertical field effect transistor of claim 67 wherein said diamond layer is a polycrystalline diamond layer, wherein said first diamond mesa is a polycrystalline first diamond mesa, and wherein said plurality of second diamond mesas are each a single diamond grain.

73. The vertical field effect transistor of claim 67 further comprising a nondiamond substrate on said diamond layer, opposite said face of said diamond layer.

74. The vertical field effect transistor of claim 73 wherein said nondiamond substrate comprises a monocrystalline silicon substrate.

75. The vertical field effect transistor of claim 73 wherein said nondiamond substrate is selected from the group consisting of crystalline silicon carbide, cubic boron nitride, crystalline copper and crystalline nickel.

76. The vertical field effect transistor of claim 67 wherein said at least one drain contact comprises at least one drain contact on said face of said diamond layer.

77. The vertical field effect transistor of claim 73 wherein said at least one drain contact comprises at least one drain contact on said nondiamond substrate, opposite said diamond layer.

78. The vertical field effect transistor of claim 77 wherein said at least one drain contact comprises a plurality of drain contacts, a respective one of which is opposite a respective one of said source contacts.

* * * * *